(12) United States Patent
Gu et al.

(10) Patent No.: US 10,622,081 B2
(45) Date of Patent: *Apr. 14, 2020

(54) SHIFT REGISTER, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Honggang Gu, Beijing (CN); Xianjie Shao, Beijing (CN); Jie Song, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 169 days.

This patent is subject to a terminal disclaimer.

(21) Appl. No.: 15/706,894

(22) Filed: Sep. 18, 2017

(65) Prior Publication Data

US 2018/0190364 A1   Jul. 5, 2018

(30) Foreign Application Priority Data

Jan. 3, 2017   (CN) .......................... 2017 1 0002734

(51) Int. Cl.
*G11C 19/00* (2006.01)
*G11C 19/18* (2006.01)
(Continued)

(52) U.S. Cl.
CPC .......... *G11C 19/184* (2013.01); *G09G 3/3674* (2013.01); *G11C 8/04* (2013.01);
(Continued)

(58) Field of Classification Search
None
See application file for complete search history.

(56) References Cited

U.S. PATENT DOCUMENTS 9,916,039 B2 * 3/2018 Gu ........................ G06F 3/0412
2008/0042965 A1  2/2008 Cheng et al.
(Continued)

FOREIGN PATENT DOCUMENTS

CN    102654969 A    9/2012
CN    103714789 A    4/2014
(Continued)

OTHER PUBLICATIONS

First Office Action for Chinese Application No. 201710002734.7, dated Nov. 29, 2018, 9 Pages.

*Primary Examiner* — Tuan T Lam
(74) *Attorney, Agent, or Firm* — Brooks Kushman P.C.

(57) ABSTRACT

A shift register, a gate driving circuit and a display device are disclosed. The shift register includes a first inputting circuit, a second inputting circuit, an outputting circuit, a node controlling circuit, a potential hold circuit and an output-noise reduction circuit. The first inputting circuit and the second inputting circuit are to implement inputting to the first node and resetting of the first node. The node control circuit controls potentials of the first node and the second node. The outputting circuit controls the signal of the signal outputting terminal under control of the first node and the second node. The potential hold circuit can continuously charge the first node within a touch control period. The output-noise reduction circuit can perform noise reduction for the signal outputting terminal in the touch control period.

20 Claims, 14 Drawing Sheets

(51) Int. Cl.
*G11C 19/28* (2006.01)
*G11C 8/04* (2006.01)
*G09G 3/36* (2006.01)
*G09G 3/20* (2006.01)

(52) U.S. Cl.
CPC .............. *G11C 19/28* (2013.01); *G09G 3/20* (2013.01); *G09G 2300/08* (2013.01); *G09G 2310/0267* (2013.01); *G09G 2310/0286* (2013.01); *G09G 2310/0291* (2013.01); *G09G 2310/08* (2013.01)

(56) References Cited

U.S. PATENT DOCUMENTS

| | | | |
|---|---|---|---|
| 2011/0221736 A1 | 9/2011 | Pak et al. | |
| 2014/0056399 A1 | 2/2014 | Shang | |
| 2014/0079173 A1* | 3/2014 | Yan | G11C 19/28 377/64 |
| 2014/0092078 A1 | 4/2014 | Yoon et al. | |
| 2015/0371716 A1* | 12/2015 | Shao | G11C 19/287 345/100 |
| 2016/0049128 A1* | 2/2016 | Shao | G09G 3/3677 345/204 |
| 2016/0225336 A1* | 8/2016 | Gu | G11C 19/28 |
| 2016/0314850 A1* | 10/2016 | Gu | G11C 19/28 |
| 2016/0343338 A1* | 11/2016 | Gu | G09G 3/3677 |
| 2017/0010731 A1 | 1/2017 | Zhang et al. | |
| 2017/0108989 A1 | 4/2017 | Gu et al. | |
| 2017/0193889 A1 | 7/2017 | Li et al. | |
| 2017/0199617 A1* | 7/2017 | Gu | G06F 3/0416 |
| 2017/0221441 A1* | 8/2017 | Gu | G06F 3/0412 |
| 2018/0046311 A1* | 2/2018 | Gu | G11C 19/28 |
| 2018/0107329 A1* | 4/2018 | Gu | G09G 3/20 |
| 2018/0204521 A1* | 7/2018 | Gu | G09G 3/36 |

FOREIGN PATENT DOCUMENTS

| | | |
|---|---|---|
| CN | 103943083 A | 7/2014 |
| CN | 104810058 A | 7/2015 |
| CN | 105185343 A | 12/2015 |
| CN | 105427829 A | 3/2016 |
| CN | 105679229 A | 6/2016 |
| CN | 205609225 U | 9/2016 |
| CN | 106128347 A | 11/2016 |
| KR | 20060097819 A | 9/2006 |

* cited by examiner

SHIFT REGISTER, GATE DRIVING CIRCUIT AND DISPLAY DEVICE

CROSS-REFERENCE TO RELATED APPLICATION

This application claims priority to Chinese patent application No. 201710002734.7 filed on Jan. 3, 2017, which is incorporated herein by reference in its entirety.

TECHNICAL FIELD

The present disclosure is related to the field of displaying technology, and in particular to a shift register, a gate driving circuit and a display device.

BACKGROUND

In a flat display panel, a gate driving circuit is generally used to provide a gate-on signal to gate electrodes of various thin film transistors at a pixel region. The gate driving circuit is formed on an array substrate of the flat display panel by using an array process, i.e., a gate driver on array (GOA) process. This process not only saves costs, but also allows the flat display panel to have a symmetric aesthetic design at two sides thereof. Meanwhile, wiring space for a bonding area and a fan-out area of a gate integrated circuit can also be eliminated, thereby achieving narrower border design.

The gate driving circuit is composed of cascaded shift registers. Each shift register is to provide a gate-on signal to a gate line connected with a signal outputting terminal of each shift register, so as to turn on a corresponding row of TFTs in the pixel region. Except for a first shift register, a signal outputting terminal of each of the rest of the shift registers is connected with the signal outputting terminal of a previous shift register. Each shift register includes a pulling-up node for controlling the signal outputting terminal to output the gate-on signal. When a potential of the pulling-up node is further pulled up, the signal outputting terminal outputs the gate-on signal.

Currently, a touch display panel is time-division driven in a display driving period and a touch driving period, that is, multiple touch control periods are inserted in a period of displaying one frame picture and each touch control period usually has a certain length of time duration. It is assumed that one touch control period begins after the signal output terminal of an n-th shift register has output a gate-on signal, the potential of the pulling-up node in a (n+1)-th shift register has changed to high potential. Since the time duration of each touch control period lasts longer, leakage may occur at the pulling-up node in the (n+1)-th shift register via a TFT connected with the pulling-up node during the time duration, and thus the potential of the pulling-up node in the (n+1)-th shift register may be decreased. When the touch control period ends and the (n+1)-th shift register starts to work, attenuation of the potential of the pulling-up node causes attenuation of a gate-on signal output from the signal outputting terminal of the (n+1)-th shift register, which may even result in that TFT in the pixel region cannot be turned on and thus cause an abnormal display of the touch display panel.

SUMMARY

In view of this, embodiments of the present disclosure provide a shift register, a gate driving circuit and a display device, which can solve the problem existed in the gate driving circuit in the related art that the potential of the pulling-up node in the next shift register of two adjacent shift registers is attenuated due to the longer time duration of one touch control period inserted between gate-on signal output from the two adjacent shift registers.

One embodiment of the present disclosure provides a shift register which includes a first inputting circuit, a second inputting circuit, an outputting circuit, a node controlling circuit, a potential hold circuit, and an output-noise reduction circuit. The first inputting circuit is configured to, under control of an input signal terminal, provide a signal from a first reference signal terminal to a first node PU. The second inputting circuit is configured to, under control of a resetting signal terminal, provide a signal from a second reference signal terminal to the first node PU. The outputting circuit is configured to, under control of the first node PU, provide a first clock signal from a first clock signal terminal to a signal outputting terminal of the shift register, and the outputting circuit is further configured to, under control of a second node, provide a signal from a third reference signal terminal to the signal outputting terminal. The potential hold circuit is configured to, under control of both the first node and a touch control terminal, provide a signal from the touch control terminal to the first node PU. The output-noise reduction circuit is configured to, under control of the touch control terminal, provide the signal from the third reference signal terminal to the signal outputting terminal. The node controlling circuit is configured to, under control of the first node, provide the signal from the third reference signal terminal to the second node. The node controlling circuit is further configured to, under control of a second clock signal terminal, provide a second clock signal from the second clock signal terminal to the second node. The node controlling circuit is further configured to, when the second node is in a floating state, hold a stable potential difference between the second node and the first clock signal terminal. Phases of the first clock signal and the second clock signal are opposite.

In a possible embodiment, the first inputting circuit includes a first transistor. A gate electrode of the first transistor is connected with the input signal terminal, a first electrode of the first transistor is connected with the first reference signal terminal, and a second electrode of the first transistor is connected with the first node.

In a possible embodiment, the second inputting circuit comprises a second transistor. A gate electrode of the second transistor is connected with the resetting signal terminal, a first electrode of the second transistor is connected with the second reference signal terminal, and a second electrode of the second transistor is connected with the first node.

In a possible embodiment, the outputting circuit comprises a third transistor, a fourth transistor and a first capacitor. A gate electrode of the third transistor is connected with the first node, a first electrode of the third transistor is connected with the first clock signal terminal, and a second electrode of the third transistor is connected with the signal outputting terminal. A gate electrode of the fourth transistor is connected with the second node, a first electrode of the fourth transistor is connected with the third reference signal terminal, and a second electrode of the fourth transistor is connected with the signal outputting terminal. The first capacitor is connected between the first node and the signal outputting terminal.

In a possible embodiment, the node control circuit comprises a fifth transistor, a sixth transistor and a second capacitor. A gate electrode of the fifth transistor is connected with the first node, a first electrode of the fifth transistor is connected with the third reference signal terminal, and a second electrode of the fifth transistor is connected with the second node. A gate electrode and a first electrode of the sixth transistor are connected with the second clock signal terminal, and a second electrode of the sixth transistor is connected with the second node. The second capacitor is connected between the second node and the first clock signal terminal.

In a possible embodiment, the potential hold circuit comprises a seventh transistor and an eighth transistor. A gate electrode of the seventh transistor is connected with the first node, a first electrode of the seventh transistor is connected with the touch control terminal, and a second electrode of the seventh transistor is connected with a gate electrode of the eighth transistor. A first electrode of the eighth transistor is connected with the touch control terminal, and a second electrode of the eighth transistor is connected with the first node.

In a possible embodiment, the potential hold circuit comprises a seventh transistor and an eighth transistor. A gate electrode and a first electrode of the seventh transistor are connected with the first node, and a second electrode of the seventh transistor is connected with a first electrode of the eighth transistor. A gate electrode and a second electrode of the eighth transistor are connected with the touch control terminal.

In a possible embodiment, the output-noise reduction circuit comprises a ninth transistor. A gate electrode of the ninth transistor is connected with touch control terminal, a first electrode of the ninth transistor is connected with the third reference signal terminal, and a second electrode of the ninth transistor is connected with the signal outputting terminal.

In a possible embodiment, the shift register further includes a node-noise reduction circuit. The node-noise reduction circuit is configured to, under control of the second node, provide the signal from the third reference signal terminal to the first node.

In a possible embodiment, the node-noise reduction circuit comprises a tenth transistor. A gate electrode of the tenth transistor is connected with the second node, a first electrode of the tenth transistor is connected with the third reference signal terminal, and a second electrode of the tenth transistor is connected with the first node.

In a possible embodiment, the output-noise reduction circuit comprises a ninth transistor, a gate electrode of the ninth transistor is connected with touch control terminal, a first electrode of the ninth transistor is connected with the third reference signal terminal, and a second electrode of the ninth transistor is connected with the signal outputting terminal.

In a possible embodiment, the node-noise reduction circuit comprises a tenth transistor, a gate electrode of the tenth transistor is connected with the second node, a first electrode of the tenth transistor is connected with the third reference signal terminal, and a second electrode of the tenth transistor is connected with the first node.

In a possible embodiment, all of the transistors are N-type transistors or P-type transistors.

One embodiment of the present disclosure further provides a gate driving circuit which includes a plurality of cascaded shift registers. Except for a first shift register, the signal outputting terminal of each of the rest of the shift registers is connected with the resetting signal terminal of a previous shift register which is adjacent the each of the rest of the shift registers. Except for a last shift register, the signal outputting terminal of each one of the rest of the shift registers is connected with the input signal terminal of a next shift register which is adjacent the each one of the rest of the shift registers.

One embodiment of the present disclosure further provides a display device which includes the above gate driving circuit.

DETAILED DESCRIPTION

Specific implementations of a shift register and a method for driving the same, a gate driving circuit and a display device according to embodiments of the present disclosure are described in detail hereinafter in conjunction with accompanying drawings.

Figure 1:
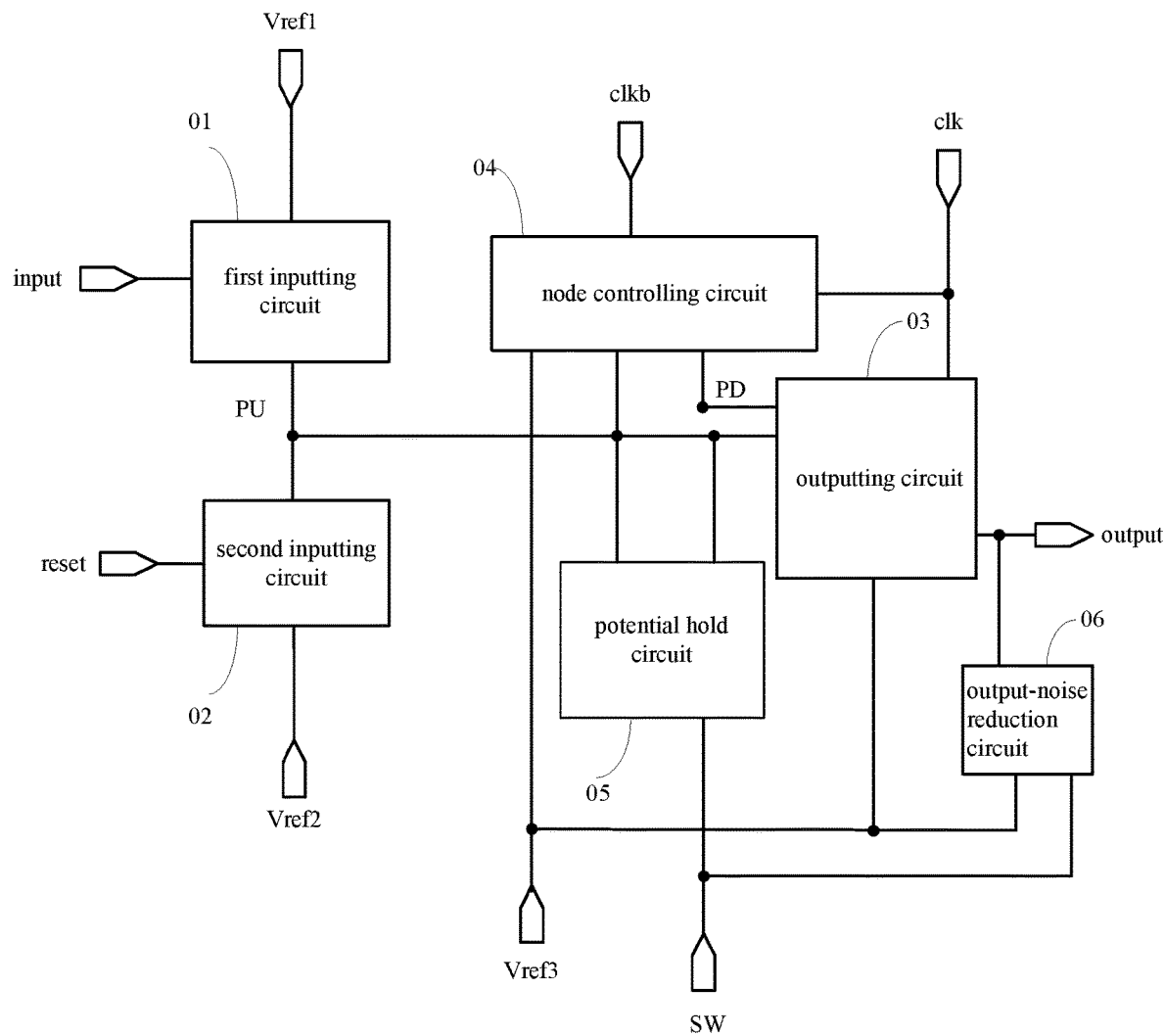
FIG. 1 is a schematic block diagram of a shift register according to an embodiment of the present disclosure.

As shown in FIG. 1, a shift register is provided in one embodiment of the present disclosure and includes a first inputting circuit 01, a second inputting circuit 02, an outputting circuit 03, a node controlling circuit 04, a potential hold circuit 05 and an output-noise reduction circuit 06.

The first inputting circuit 01 is to, under control of an input signal terminal, provide a signal from a first reference signal terminal Vref1 to a first node PU.

The second inputting circuit 02 is to, under control of a resetting signal terminal, provide a signal from a second reference signal terminal Vref2 to the first node PU.

The outputting circuit 03 is to, under control of the first node PU, provide a first clock signal from a first clock signal terminal clk to a signal outputting terminal of the shift register. The outputting circuit 03 is further to, under control of a second node PD, provide a signal from a third reference signal terminal Vref3 to the signal outputting terminal of the shift register.

The potential hold circuit 05 is to, under control of both the first node PU and a touch control terminal SW, provide a signal from the touch control terminal SW to the first node PU.

The output-noise reduction circuit 06 is to, under control of the touch control terminal SW, provide the signal from the third reference signal terminal Vref3 to the signal outputting terminal.

The node controlling circuit 04 is to, under control of the first node PU, provide the signal from the third reference signal terminal Vref3 to the second node PD. The node controlling circuit 04 is further to, under control of a second clock signal terminal clkb, provide a second clock signal from the second clock signal terminal clkb to the second node PD. The node controlling circuit 04 is further to, when the second node PD is in a floating state, hold a stable potential difference between the second node PD and the first clock signal terminal clk.

Phases of the first clock signal and the second clock signal are opposite.

According to the above shift register of one embodiment of the present disclosure, the first inputting circuit, the second inputting circuit, the outputting circuit, the node controlling circuit, the potential hold circuit and the output-noise reduction circuit are included. The first inputting circuit and the second inputting circuit are to implement inputting to the first node and resetting of the first node. The node control circuit controls potentials of the first node and the second node. The outputting circuit controls the signal of the signal outputting terminal under control of the first node and the second node. So basic functions of the shift register can be realized. Further, due to the presence of the potential hold circuit, the first node can be continuously charged within a touch control period by the potential hold circuit, thereby holding the potential of the first node and preventing the potential of the first node from being attenuated over time. Due to the presence of the output-noise reduction circuit, within the touch control period, the output-noise reduction circuit can perform noise reduction for the signal outputting terminal, thereby preventing a touch signal from being disturbed by the signal of the signal outputting terminal.

Moreover, in the above shift register of one embodiment of the present disclosure, since the first inputting circuit and the second inputting circuit are symmetric, the shift register may have a bidirectional scanning function.

According to the above shift register of one embodiment of the present disclosure, since the potential hold circuit can provide the signal from the touch control terminal to the first node for charging the first node under control of both the first node and the touch control terminal, thereby preventing the potential of the first node from being attenuated. Thus, the above shift register may be applied to the full in cell touch panel under H-blank mode (i.e., inserting touch control periods in display periods). Further, since the output-noise reduction circuit can provide the signal from the third reference signal terminal to the signal outputting terminal under control of the touch control terminal, the touch signal can be prevented from being disturbed by the signal of the signal outputting terminal.

Of course, the above shift register may also be applied to the full in cell touch panel under V-blank mode (i.e., inserting a touch control time period between two frame display). In this case, after the previous frame ends and before the next frame begins, the output-noise reduction circuit can provide the signal from the third reference signal terminal to the signal outputting terminal under control of the touch control terminal, thereby performing noise reduction for the signal outputting terminal. Since the potential hold circuit is controlled by both the first node and the touch control terminal, during the touch control periods in this model, the potential hold circuit does not affect the first node.

Of course, the above shift register may also be suitable in the typical gate driving mode (i.e., there are only display periods, without touch control periods). In this case, both of the potential hold circuit and the output-noise reduction circuit do not work.

The present disclosure is described in detail hereinafter with references to several embodiments. It should be noted, the following embodiments are intended to explain the present disclosure, and are not used to limit the scope of the present disclosure.

In the above shift register of one embodiment of the present disclosure, as shown in FIG. 2 to FIG. 5, the first inputting circuit 01 includes a first transistor M1.

A gate electrode of the first transistor M1 is connected with the input signal terminal, a first electrode of the first transistor M1 is connected with the first reference signal terminal Vref1, and a second electrode of the first transistor M1 is connected with the first node PU.

A specific structure of the first inputting circuit of the shift register is merely described above by way of example, and in a specific implementation, the specific structure of the first inputting circuit is not limited to the above structure according to the embodiments of the present disclosure, and may also be another structure well-known for those skilled in the art, which is not limited here.

In the above shift register of one embodiment of the present disclosure, as shown in FIG. 2 to FIG. 5, the second inputting circuit 02 includes a second transistor M2.

A gate electrode of the second transistor M2 is connected with the resetting signal terminal, a first electrode of the second transistor M2 is connected with the second reference signal terminal Vref2, and a second electrode of the second transistor M2 is connected with the first node PU.

A specific structure of the second inputting circuit of the shift register is merely described above by way of example, and in a specific implementation, the specific structure of the second inputting circuit is not limited to the above structure according to the embodiments of the present disclosure, and may also be another structure well-known for those skilled in the art, which is not limited here.

In the above shift register of one embodiment of the present disclosure, as shown in FIG. 2 to FIG. 5, the outputting circuit 03 includes a third transistor M3, a fourth transistor M4 and a first capacitor C1.

A gate electrode of the third transistor M3 is connected with the first node PU, a first electrode of the third transistor M3 is connected with the first clock signal terminal clk, and a second electrode of the third transistor M3 is connected with the signal outputting terminal.

A gate electrode of the fourth transistor M4 is connected with the second node PD, a first electrode of the fourth transistor M4 is connected with the third reference signal terminal Vref3, and a second electrode of the fourth transistor M4 is connected with the signal outputting terminal.

The first capacitor C1 is connected between the first node PU and the signal outputting terminal.

A specific structure of the outputting circuit of the shift register is merely described above by way of example, and in a specific implementation, the specific structure of the outputting circuit is not limited to the above structure according to the embodiments of the present disclosure, and may also be another structure well-known for those skilled in the art, which is not limited here.

In the above shift register of one embodiment of the present disclosure, as shown in FIG. 2 to FIG. 5, the node control circuit 04 includes a fifth transistor M5, a sixth transistor M6 and a second capacitor C2.

A gate electrode of the fifth transistor M5 is connected with the first node PU, a first electrode of the fifth transistor M5 is connected with the third reference signal terminal Vref3, and a second electrode of the fifth transistor M5 is connected with the second node PD.

A gate electrode and a first electrode of the sixth transistor M6 are connected with the second clock signal terminal clkb, and a second electrode of the sixth transistor M6 is connected with the second node PD.

The second capacitor C2 is connected between the second node PD and the first clock signal terminal clk.

A specific structure of the node control circuit of the shift register is merely described above by way of example, and in a specific implementation, the specific structure of the node control circuit is not limited to the above structure according to the embodiments of the present disclosure, and may also be another structure well-known for those skilled in the art, which is not limited here.

In the above shift register of one embodiment of the present disclosure, as shown in FIG. 2 to FIG. 5, the potential hold circuit 05 includes a seventh transistor M7 and an eighth transistor M8.

Figure 2:
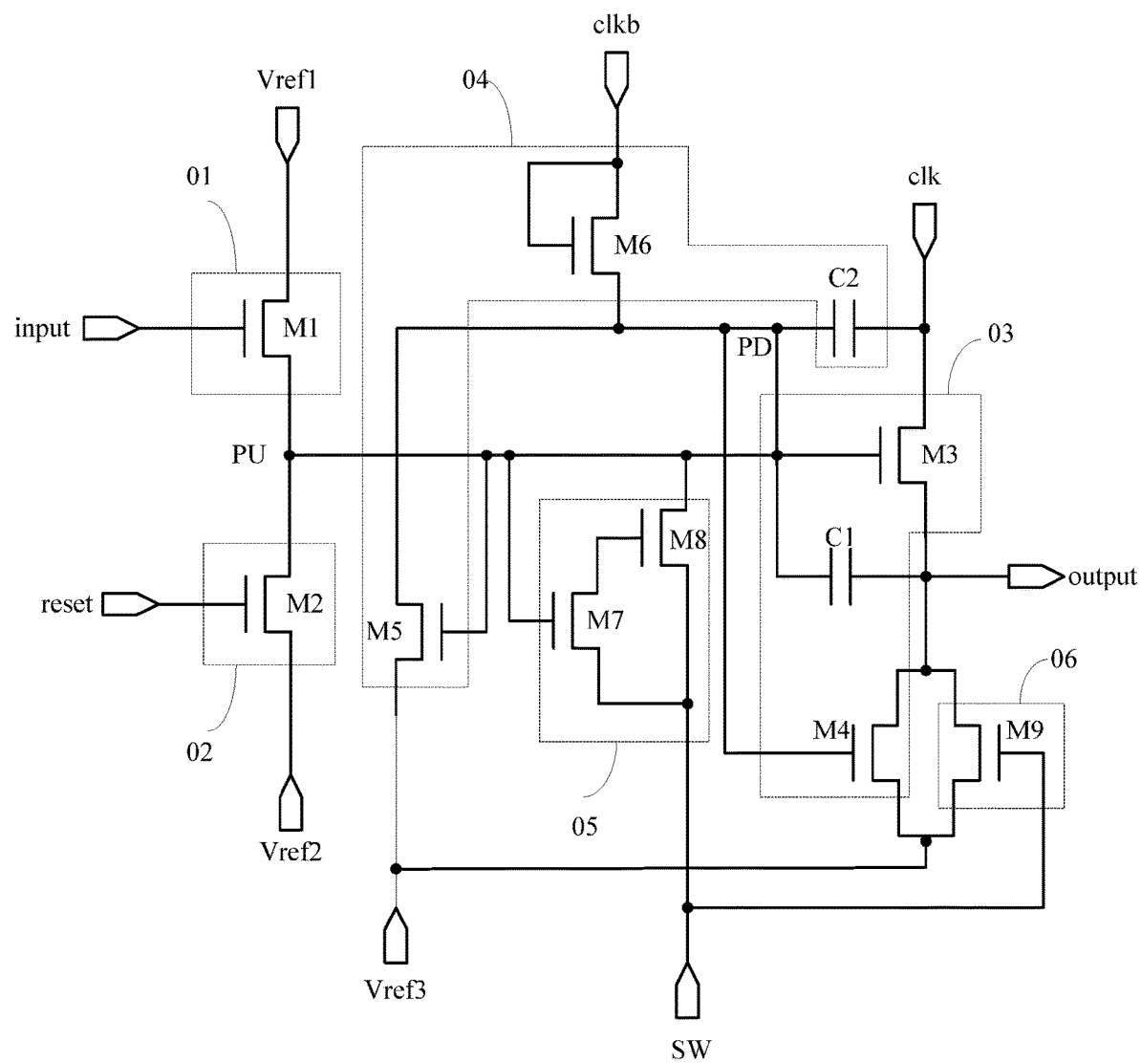
FIG. 2 is a schematic diagram of a first example of the shift register according to an embodiment of the present disclosure.
Figure 3:
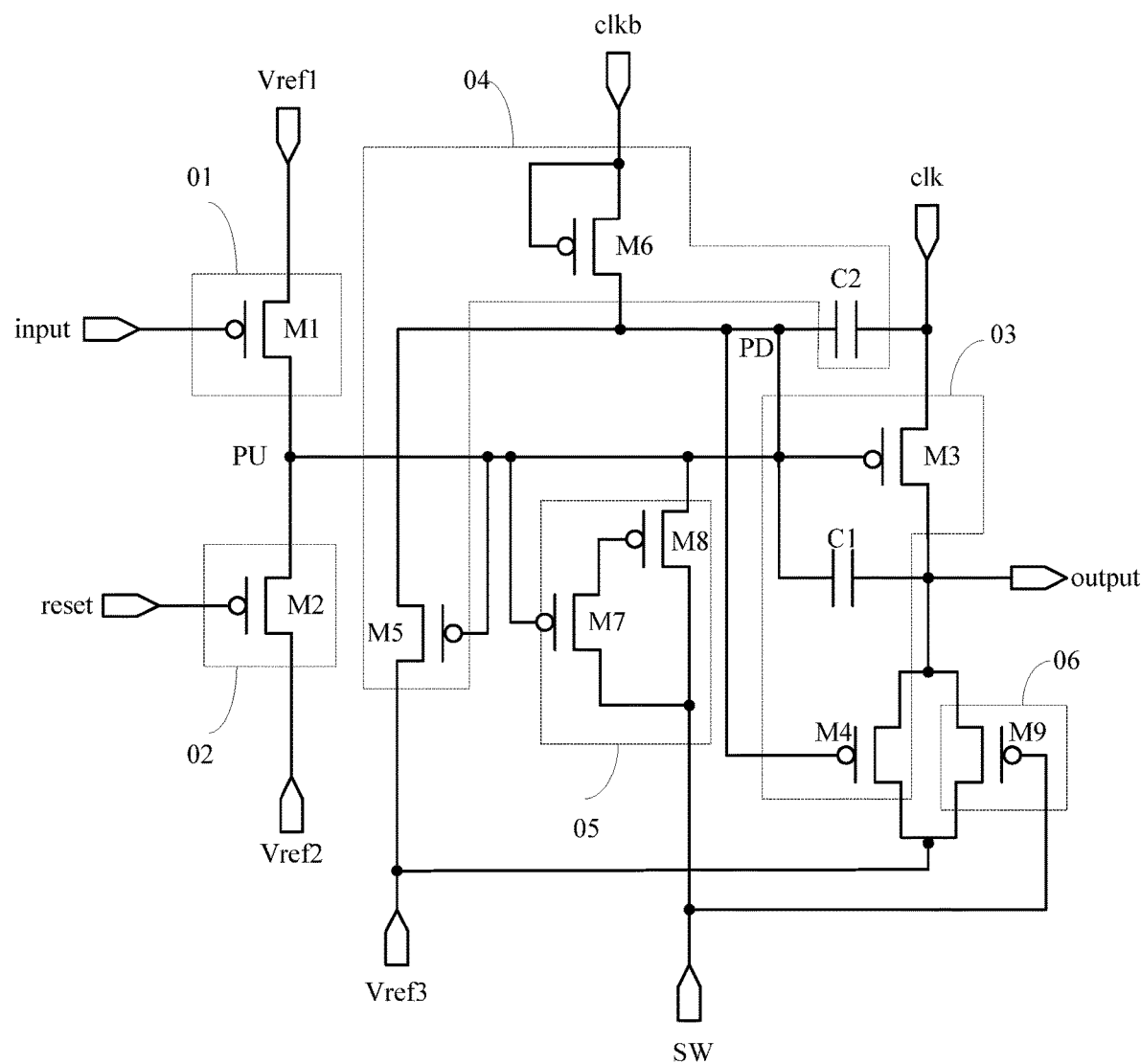
FIG. 3 is a schematic diagram of a second example of the shift register according to an embodiment of the present disclosure.

As shown in FIG. 2 and FIG. 3, a gate electrode of the seventh transistor M7 is connected with the first node PU, a first electrode of the seventh transistor M7 is connected with the touch control terminal SW, and a second electrode of the seventh transistor M7 is connected with a gate electrode of the eighth transistor M8. A first electrode of the eighth transistor M8 is connected with the touch control terminal SW, and a second electrode of the eighth transistor M8 is connected with the first node PU.

Figure 4:
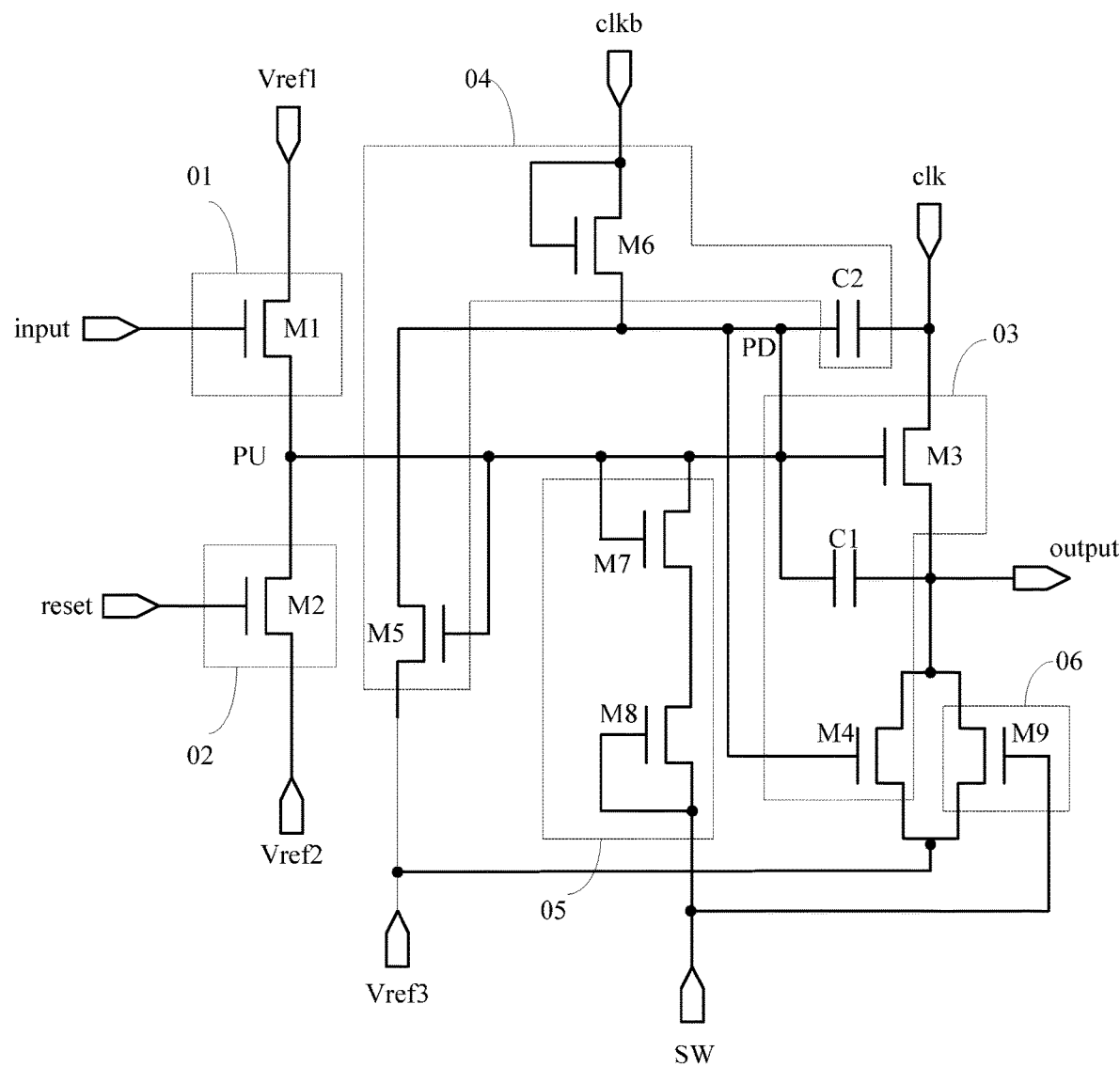
FIG. 4 is a schematic diagram of a third example of the shift register according to an embodiment of the present disclosure.
Figure 5:
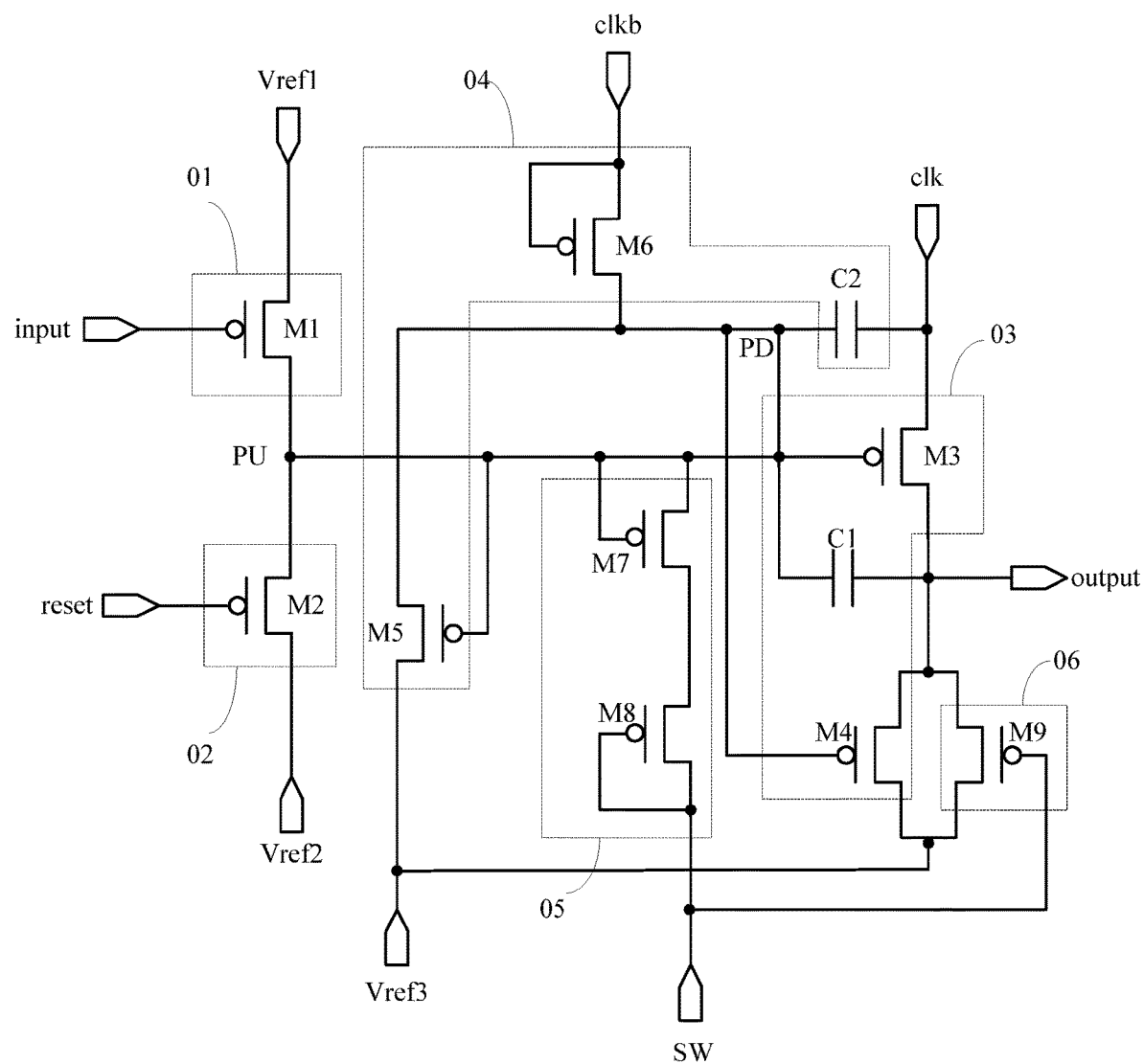
FIG. 5 is a schematic diagram of a fourth example of the shift register according to an embodiment of the present disclosure.

Alternatively, as shown in FIG. 4 and FIG. 5, the gate electrode and the first electrode of the seventh transistor M7 are connected with the first node PU, and the second electrode of the seventh transistor M7 is connected with the first electrode of the eighth transistor M8. The gate electrode and the second electrode of the eighth transistor M8 are connected with the touch control terminal SW.

In actual implementation, since the potential hold circuit charges the first node under control of both the first node and the touch control terminal, only the potential hold circuit that is in one shift register of which one first node has been charged, can continue charging the one first node, thereby realizing that when a touch control period is inserted after the input signal terminal of the shift register inputs a signal, the potential of the first node can still be maintained after the touch control period.

In actual implementation, when the seventh transistor M7 and the eighth transistor M8 are connected in a connection manner shown in FIG. 2 and FIG. 3, it may reduce impacts applied by coupling effects of the touch control terminal SW to voltages of first nodes PU of shift registers in other rows. When the seventh transistor M7 and the eighth transistor M8 are connected in a connection manner shown in FIG. 4 and FIG. 5, it may provide a better compensating charging effect for the first node PU in the shift register of the same row.

A specific structure of the potential hold circuit of the shift register is merely described above by way of example, and in a specific implementation, the specific structure of the potential hold circuit is not limited to the above structure according to the embodiments of the present disclosure, and may also be another structure well-known for those skilled in the art, which is not limited here.

In the above shift register of one embodiment of the present disclosure, as shown in FIG. 2 to FIG. 5, the output-noise reduction circuit 06 includes a ninth transistor M9.

A gate electrode of the ninth transistor M9 is connected with touch control terminal SW, a first electrode of the ninth transistor M9 is connected with the third reference signal terminal Vref3, and a second electrode of the ninth transistor M9 is connected with the signal outputting terminal.

A specific structure of the output-noise reduction circuit of the shift register is merely described above by way of example, and in a specific implementation, the specific structure of the output-noise reduction circuit is not limited to the above structure according to the embodiments of the present disclosure, and may also be another structure well-known for those skilled in the art, which is not limited here.

Optionally, as shown in FIG. 6 to FIG. 9, the above shift register of one embodiment of the present disclosure may further include a node-noise reduction circuit 07.

The node-noise reduction circuit 07 is to, under control of the second node PD, provide the signal from the third reference signal terminal Vref3 to the first node PU. So, after the signal outputting terminal outputs a gate-on signal, it can ensure that a sufficient noise reduction is performed for the potential of the first node PU, thereby ensuring output stability.

In the above shift register of one embodiment of the present disclosure, as shown in FIG. 6 to FIG. 9, the node-noise reduction circuit 07 includes a tenth transistor M10.

A gate electrode of the tenth transistor M10 is connected with the second node PD, a first electrode of the tenth transistor M10 is connected with the third reference signal terminal Vref3, and a second electrode of the tenth transistor M10 is connected with the first node PU.

A specific structure of the node-noise reduction circuit of the shift register is merely described above by way of example, and in a specific implementation, the specific structure of the node-noise reduction circuit is not limited to the above structure according to the embodiments of the present disclosure, and may also be another structure well-known for those skilled in the art, which is not limited here.

Optionally, in the above shift register of one embodiment of the present disclosure, in order to simply manufacturing process, the transistors of the same type are generally used, thus all of the transistors may be N-type transistors or P-type transistors. In actual implementation, when the potential of the gate-on signal is required to be high potential, all of the transistors may be N-type transistors; when the potential of the gate-on signal is required to be low potential, all of the transistors may be P-type transistors.

In actual implementation, the N-type transistors are turned on under action of high potential, and are turned off under action of low potential; the P-type transistors are turned off under action of high potential, and are turned on under action of low potential.

It should be noted that the transistors mentioned in the above embodiments are metal oxide semiconductor (MOS) field effect transistors. In actual implementation, first electrodes of these transistors are source electrodes, and second electrodes of these transistors are drain electrodes; alternatively, first electrodes of these transistors are drain electrodes, and second electrodes of these transistors are source electrodes.

Further, in the above shift register of one embodiment of the present disclosure, since the first inputting circuit and the second inputting circuit are symmetric, they can be used interchangeably, and thus the above shift register of one embodiment of the present disclosure may have a bidirectional scanning function. When scanning in a forward direction, the input signal terminal receives an input signal, the resetting signal terminal receives a resetting signal, the first inputting circuit is provided with an inputting function and the second inputting circuit is provided with a resetting function. When scanning in a reverse direction, the input signal terminal receives a resetting signal, the resetting signal terminal receives an input signal, the second inputting circuit is provided with the inputting function and the first inputting circuit is provided with the resetting function.

In actual implementation, in the above shift register of one embodiment of the present disclosure, when the potential of the gate-on signal is required to be high potential, in the display period, the potential of the touch control terminal is low potential; in the touch control period, the potential of the touch control terminal is high potential. When scanning in the forward direction, the potential of the first reference signal terminal is high potential, and the potentials of the second reference signal terminal and the third reference signal terminal are low potential. When scanning in the reverse direction, the potential of the second reference signal terminal is high potential, and the potentials of the first reference signal terminal and the third reference signal terminal are low potential.

In actual implementation, in the above shift register of one embodiment of the present disclosure, when the potential of the gate-on signal is required to be low potential, in the display period, the potential of the touch control terminal is high potential; in the touch control period, the potential of the touch control terminal is low potential. When scanning in the forward direction, the potential of the first reference signal terminal is low potential, and the potentials of the second reference signal terminal and the third reference signal terminal are high potential. When scanning in the reverse direction, the potential of the second reference signal terminal is low potential, and the potentials of the first reference signal terminal and the third reference signal terminal are high potential.

Hereinafter, by taking scanning in the forward direction as an example, operations of the shift register of the embodiments of the present disclosure are described in detail in conjunction with circuit timing sequence diagrams. In the following description, 1 indicates for a high potential signal and 0 indicates for a low potential signal.

First Example

Figure 6:
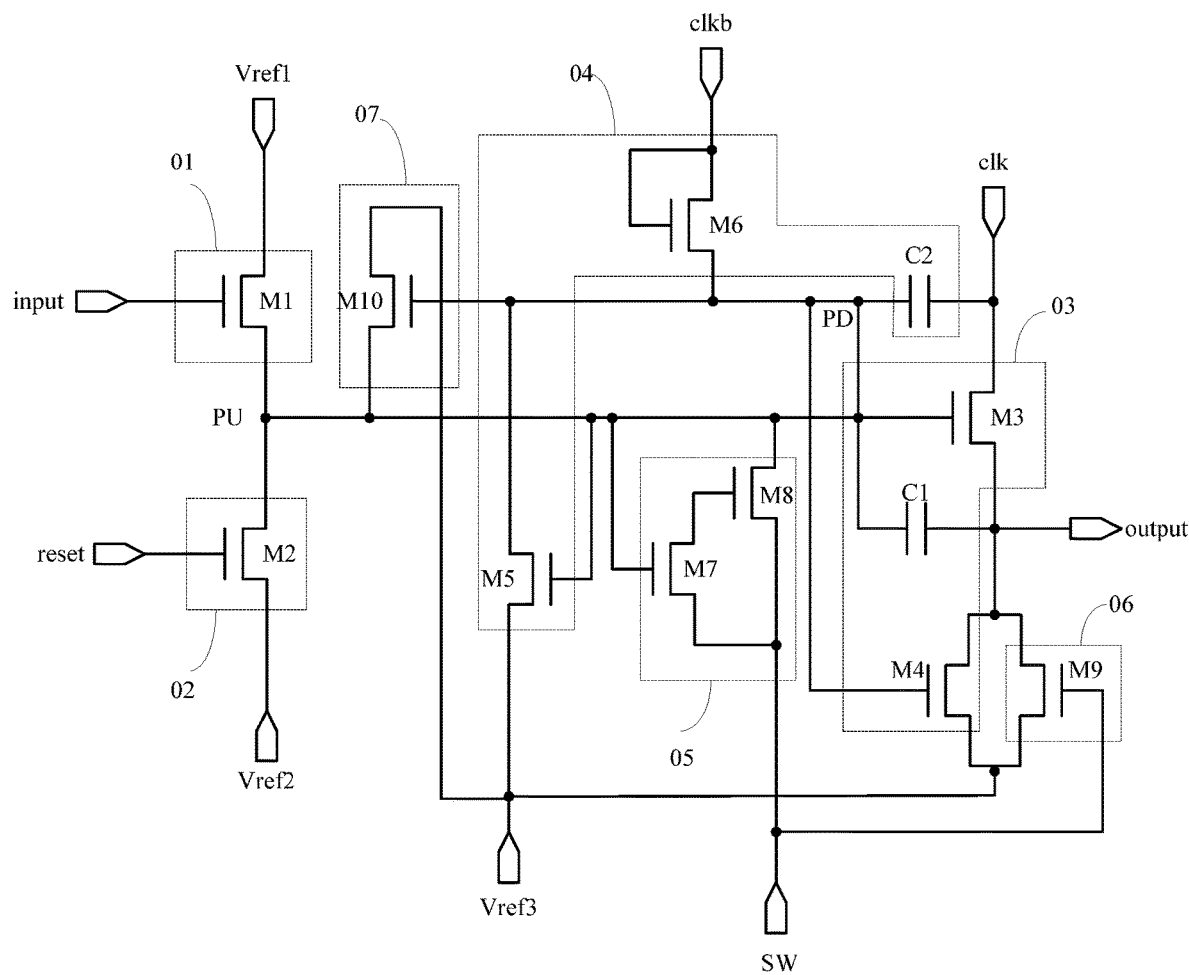
FIG. 6 is a schematic diagram of a fifth example of the shift register according to an embodiment of the present disclosure.
Figure 8:
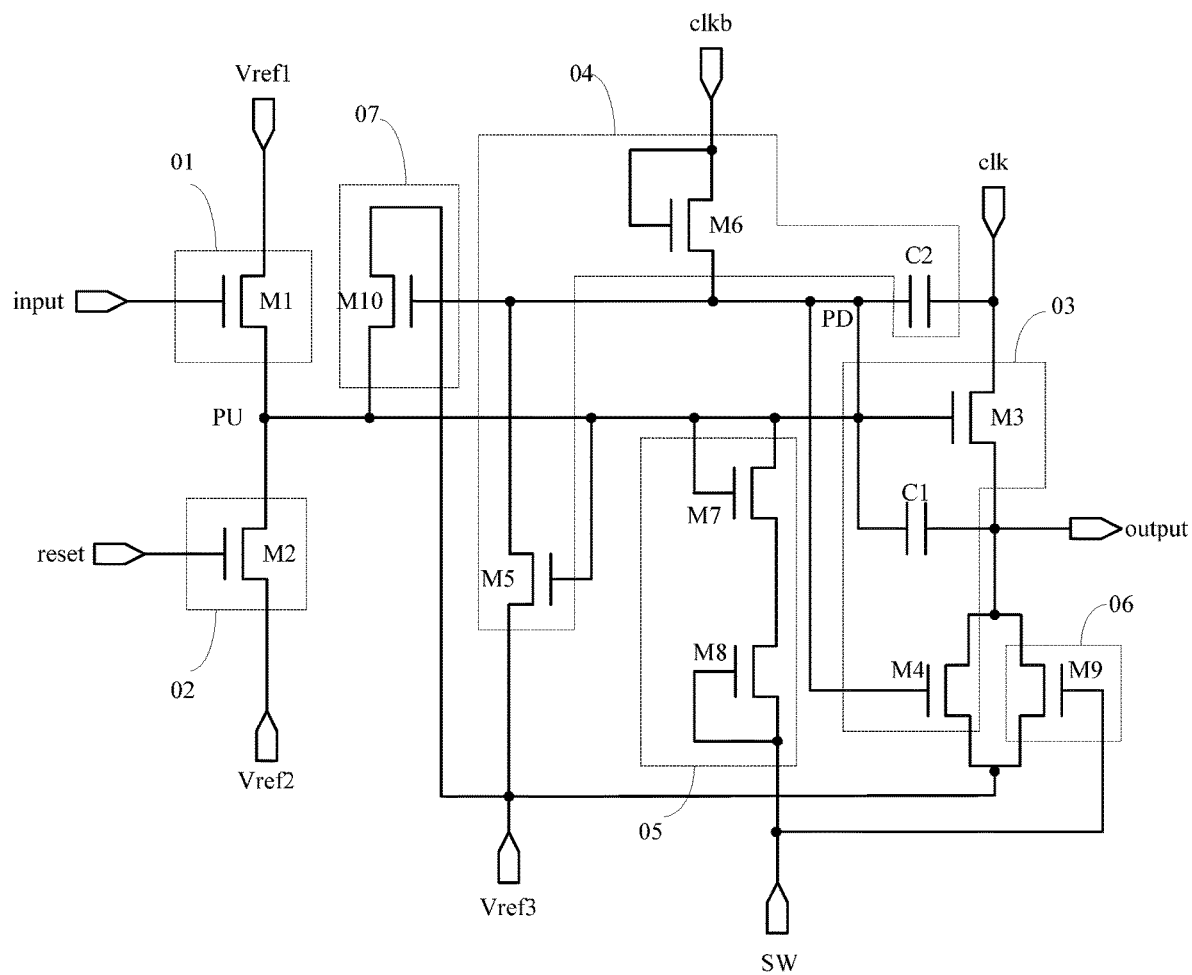
FIG. 8 is a schematic diagram of a seventh example of the shift register according to an embodiment of the present disclosure.
Figure 10:
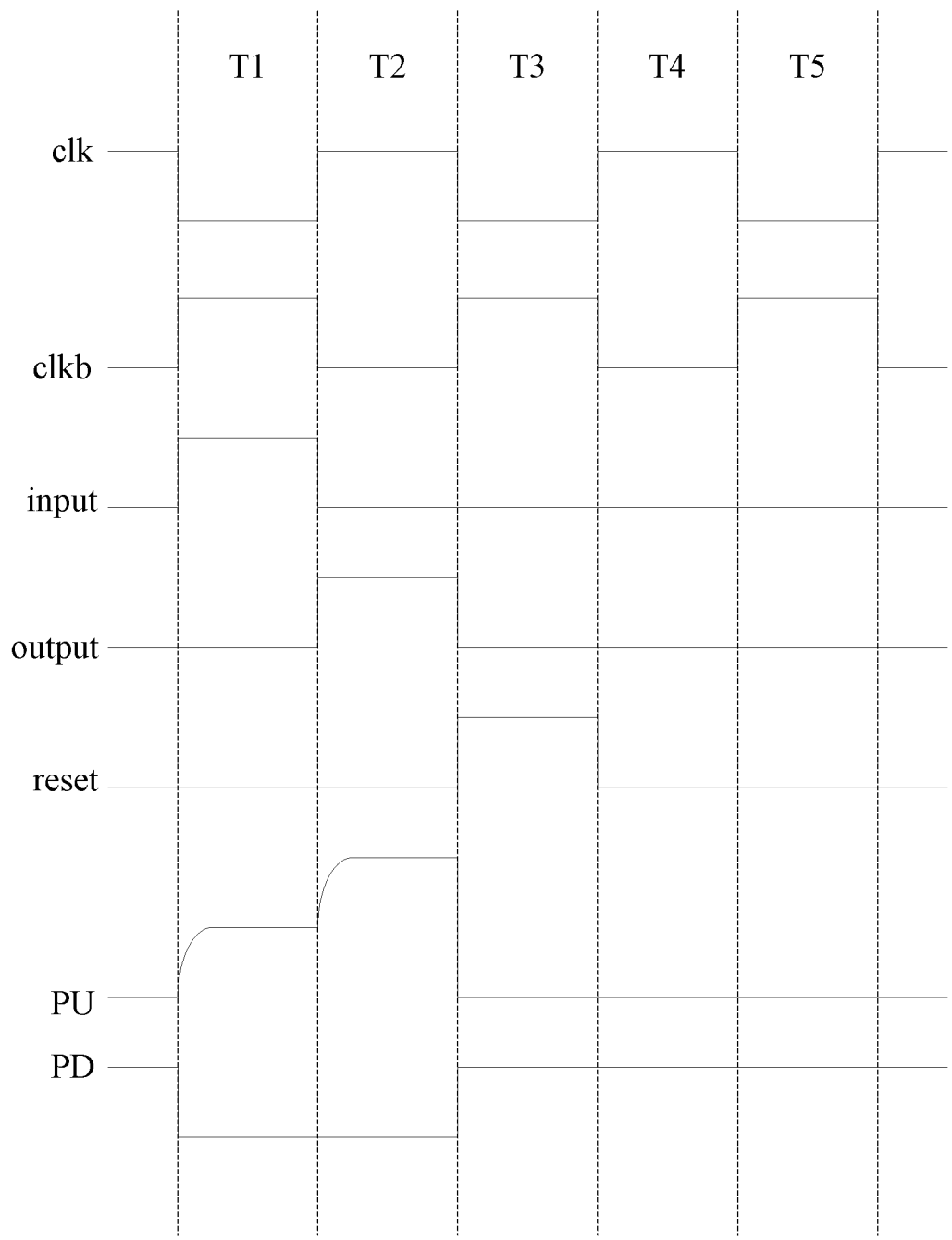
FIG. 10 is a sequence diagram of input and output corresponding to the shift registers shown in FIG. 6 and FIG. 8.

Taking the shift registers shown in FIG. 6 and FIG. 8 as an example, in the shift registers shown in FIG. 6 and FIG. 8, all of the transistors are N-type transistors, the first reference signal terminal is of high potential, the second reference signal terminal is of low potential, the third reference signal terminal is of low potential, the touch control terminal is of low potential in the display period, and the touch control terminal is of high potential in the touch control period. One corresponding sequence diagram of input and output is shown in FIG. 10.

At stage T1, input=1, reset=0, clk=0, clkb=1.

The signal from the input signal terminal enables the first transistor M1 to turn on, the signal from the first reference signal terminal Vref1 pulls up the potential of the first node PU through the first transistor M1. The first node PU controls the fifth transistor M5 and the seventh transistor M7 to turn on. The second clock signal terminal clkb controls the sixth transistor M6 to turn on. In order to make the potential of the second node PD at this stage be low potential, the fifth transistor M5 is designed to have a size greater than that of the sixth transistor M6, and a ratio of the size of the fifth transistor M5 and the size of the sixth transistor M6 is about 5:1. Then the signal from the third reference signal terminal Vref3 pulls down the potential of the second node PD through the fifth transistor M5. So, the first node PU of high potential enables the third transistor M3 to turn on, and the signal outputting terminal is of low potential. Further, the second node PD of low potential enables the fourth transistor M4 and the tenth transistor M10 to turn off, thereby ensuring output stability of the signal outputting terminal.

At stage T2, input=0, reset=0, clk=1, clkb=0.

The first node PU is in a floating state, the first node PU is still of high potential, the third transistor M3 is still turned on, but the potential of the first clock signal terminal clk is changed from low potential to high potential. Due to the bootstrap effect of the first capacitor C1, the potential of the first node PU is further pulled up. Meanwhile, the first node PU controls the fifth transistor M5 and the seventh transistor M7 to turn on. The signal from the third reference signal terminal Vref3 pulls down the potential of the second node PD through the fifth transistor M5. Then, the signal from the first clock signal terminal clk enables the signal outputting terminal to be of high potential through the third transistor M3. Further, the second node PD of low potential enables the fourth transistor M4 and the tenth transistor M10 to turn off, thereby ensuring output stability of the signal outputting terminal.

At stage T3, input=0, reset=1, clk=0, clkb=1.

The signal from the resetting signal terminal enables the second transistor M2 to turn on. The signal from the second reference signal terminal Vref2 pulls down the potential of the first node PU through the second transistor M2. The signal from the second clock signal terminal clkb enables the sixth transistor M6 to turn on. The signal from the second clock signal terminal clkb pulls up the potential of the second node PD through the sixth transistor M6. The second node PD controls the fourth transistor M4 to turn on. The signal from the third reference signal terminal Vref3 enables the signal outputting terminal to be of low potential through the fourth transistor M4. Meanwhile, the second node PD controls the tenth transistor M10 to turn on. The signal from the third reference signal terminal Vref3 pulls down the potential of the first node through the tenth transistor M10, thereby further enabling the third transistor M3 to turn off, eliminating noise voltage at the first clock signal terminal clk and ensuring output stability of the signal outputting terminal.

At stage T4, input=0, reset=0, clk=1, clkb=0.

The second node PD is in a floating state, since the potential of the first clock signal terminal clk is changed from low potential to high potential, due to the bootstrap effect of the second capacitor C2, the potential of the second node PD is further pulled up, the second node PD controls the fourth transistor M4 to turn on, the signal from the third reference signal terminal Vref3 enables the signal outputting terminal to be of low potential through the fourth transistor M4. Meanwhile, the second node PD controls the tenth transistor M10 to turn on. The signal from the third reference signal terminal Vref3 pulls down the potential of the first node through the tenth transistor M10, thereby further enabling the third transistor M3 to turn off, eliminating noise voltage at the first clock signal terminal clk and ensuring output stability of the signal outputting terminal.

At stage T5, input=0, reset=0, clk=0, clkb=1.

The signal from the second clock signal terminal clkb enables the sixth transistor M6 to turn on. The signal from the second clock signal terminal clkb pulls up the potential of the second node PD through the sixth transistor M6. The second node PD controls the fourth transistor M4 to turn on. The signal from the third reference signal terminal Vref3 enables the signal outputting terminal to be of low potential through the fourth transistor M4. Meanwhile, the second node PD controls the tenth transistor M10 to turn on. The signal from the third reference signal terminal Vref3 pulls down the potential of the first node through the tenth transistor M10, thereby further enabling the third transistor M3 to turn off, eliminating noise voltage at the first clock signal terminal clk and ensuring output stability of the signal outputting terminal.

Later, the stages T4 and T5 continue to an end of one frame. This example is suitable for the typical GOA mode as well as the full in cell display panel in the V-blank mode. In the V-blank mode, one touch control period is inserted after one frame ends and before the next frame begins. In the touch control period, the touch control terminal is of high potential and enables the ninth transistor to turn on, and the signal from the third reference signal terminal performs noise reduction for the signal outputting terminal through the ninth transistor.

Second Example

Figure 11:
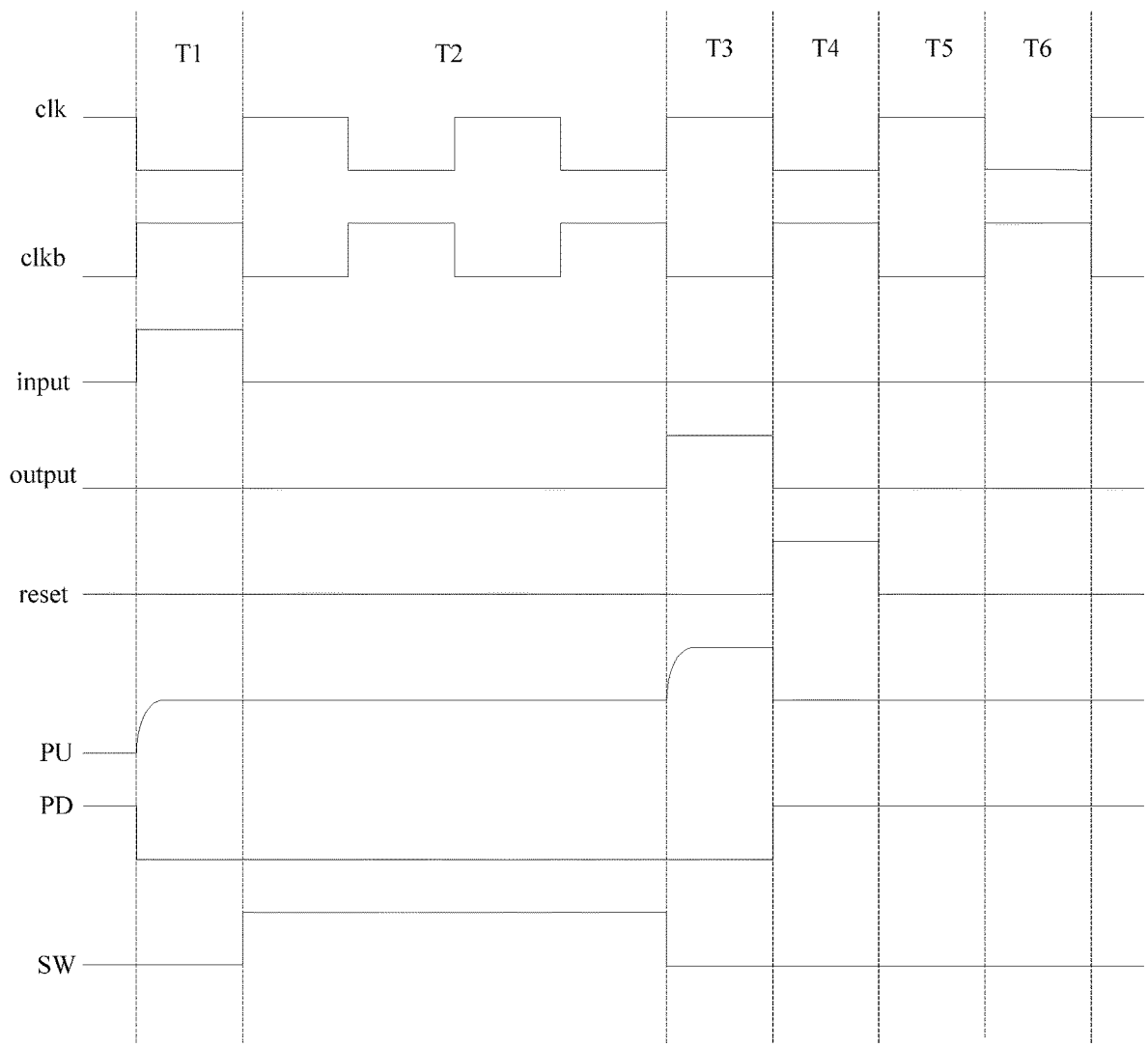
FIG. 11 is another sequence diagram of input and output corresponding to the shift registers shown in FIG. 6 and FIG. 8.

Taking the shift registers shown in FIG. 6 and FIG. 8 as an example, another corresponding sequence diagram of input and output is shown in FIG. 11.

At stage T1, input=1, reset=0, clk=0, clkb=1, SW=0.

The signal from the input signal terminal enables the first transistor M1 to turn on, the signal from the first reference signal terminal Vref1 pulls up the potential of the first node PU through the first transistor M1. The first node PU controls the fifth transistor M5 and the seventh transistor M7 to turn on. The second clock signal terminal clkb controls the sixth transistor M6 to turn on. In order to make the potential of the second node PD at this stage be low potential, the fifth transistor M5 is designed to have a size greater than that of the sixth transistor M6, and a ratio of the size of the fifth transistor M5 and the size of the sixth transistor M6 is about 5:1. Then the signal from the third reference signal terminal Vref3 pulls down the potential of the second node PD through the fifth transistor M5. So, the first node PU of high potential enables the third transistor M3 to turn on, and the signal outputting terminal is of low potential. Further, the second node PD of low potential enables the fourth transistor M4 and the tenth transistor M10 to turn off, thereby ensuring output stability of the signal outputting terminal.

At stage T2, input=0, reset=0, clk=1 or 0, clkb=1 or 0, SW=1.

In the first half of the clock cycle, the first node PU is in a floating state, the first node PU is still of high potential, the third transistor M3 is still turned on, but the potential of the first clock signal terminal clk is changed from low potential to high potential. Due to the bootstrap effect of the first capacitor C1, the potential of the first node PU is further pulled up. Meanwhile, the first node PU controls the fifth transistor M5 and the seventh transistor M7 to turn on. The signal from the third reference signal terminal Vref3 pulls down the potential of the second node PD through the fifth transistor M5. Meanwhile, the eight transistor M8 is turned on, and the first node PU is charged by the signal from the touch control terminal SW. Further, the touch control terminal SW controls the ninth transistor to turn on, and the third reference signal terminal Vref3 performs noise reduction for the signal outputting terminal through the ninth transistor M9.

Latter, no matter how the potentials of the first clock signal terminal clk and the second clock signal terminal clkb, the signal form the touch control terminal SW continuously charges the first node PU, thereby preventing attenuation of the potential of the first node PU. Since the third reference signal terminal Vref3 performs noise reduction for the signal outputting terminal through the ninth transistor M9, it is ensured that the signal outputting terminal is of low potential, thereby preventing a touch signal from being disturbed.

At stage T3, input=0, reset=0, clk=1, clkb=0, SW=0.

The first node PU is in a floating state, the first node PU is still of high potential, the third transistor M3 is still turned on, but the potential of the first clock signal terminal clk is changed from low potential to high potential. Due to the bootstrap effect of the first capacitor C1, the potential of the first node PU is further pulled up. Meanwhile, the first node PU controls the fifth transistor M5 and the seventh transistor M7 to turn on. The signal from the third reference signal terminal Vref3 pulls down the potential of the second node PD through the fifth transistor M5. Then, the signal from the first clock signal terminal clk enables the signal outputting terminal to be of high potential through the third transistor M3. Further, the second node PD of low potential enables the fourth transistor M4 and the tenth transistor M10 to turn off, thereby ensuring output stability of the signal outputting terminal.

At stage T4, input=0, reset=1, clk=0, clkb=1, SW=1.

The signal from the resetting signal terminal enables the second transistor M2 to turn on. The signal from the second reference signal terminal Vref2 pulls down the potential of the first node PU through the second transistor M2. The signal from the second clock signal terminal clkb enables the sixth transistor M6 to turn on. The signal from the second clock signal terminal clkb pulls up the potential of the second node PD through the sixth transistor M6. The second node PD controls the fourth transistor M4 to turn on. The signal from the third reference signal terminal Vref3 enables the signal outputting terminal to be of low potential through the fourth transistor M4. Meanwhile, the second node PD controls the tenth transistor M10 to turn on. The signal from the third reference signal terminal Vref3 pulls down the potential of the first node through the tenth transistor M10, thereby further enabling the third transistor M3 to turn off, eliminating noise voltage at the first clock signal terminal clk and ensuring output stability of the signal outputting terminal.

At stage T5, input=0, reset=0, clk=1, clkb=0, SW=1.

The second node PD is in a floating state, since the potential of the first clock signal terminal clk is changed from low potential to high potential, due to the bootstrap effect of the second capacitor C2, the potential of the second node PD is further pulled up, the second node PD controls the fourth transistor M4 to turn on, the signal from the third reference signal terminal Vref3 enables the signal outputting terminal to be of low potential through the fourth transistor M4. Meanwhile, the second node PD controls the tenth transistor M10 to turn on. The signal from the third reference signal terminal Vref3 pulls down the potential of the first node through the tenth transistor M10, thereby further enabling the third transistor M3 to turn off, eliminating noise voltage at the first clock signal terminal clk and ensuring output stability of the signal outputting terminal.

At stage T6, input=0, reset=0, clk=0, clkb=1, SW=1.

The signal from the second clock signal terminal clkb enables the sixth transistor M6 to turn on. The signal from the second clock signal terminal clkb pulls up the potential of the second node PD through the sixth transistor M6. The second node PD controls the fourth transistor M4 to turn on. The signal from the third reference signal terminal Vref3 enables the signal outputting terminal to be of low potential through the fourth transistor M4. Meanwhile, the second node PD controls the tenth transistor M10 to turn on. The signal from the third reference signal terminal Vref3 pulls down the potential of the first node through the tenth transistor M10, thereby further enabling the third transistor M3 to turn off, eliminating noise voltage at the first clock signal terminal clk and ensuring output stability of the signal outputting terminal.

This example is suitable for the full in cell display panel in the H-blank mode.

Third Example

Figure 7:
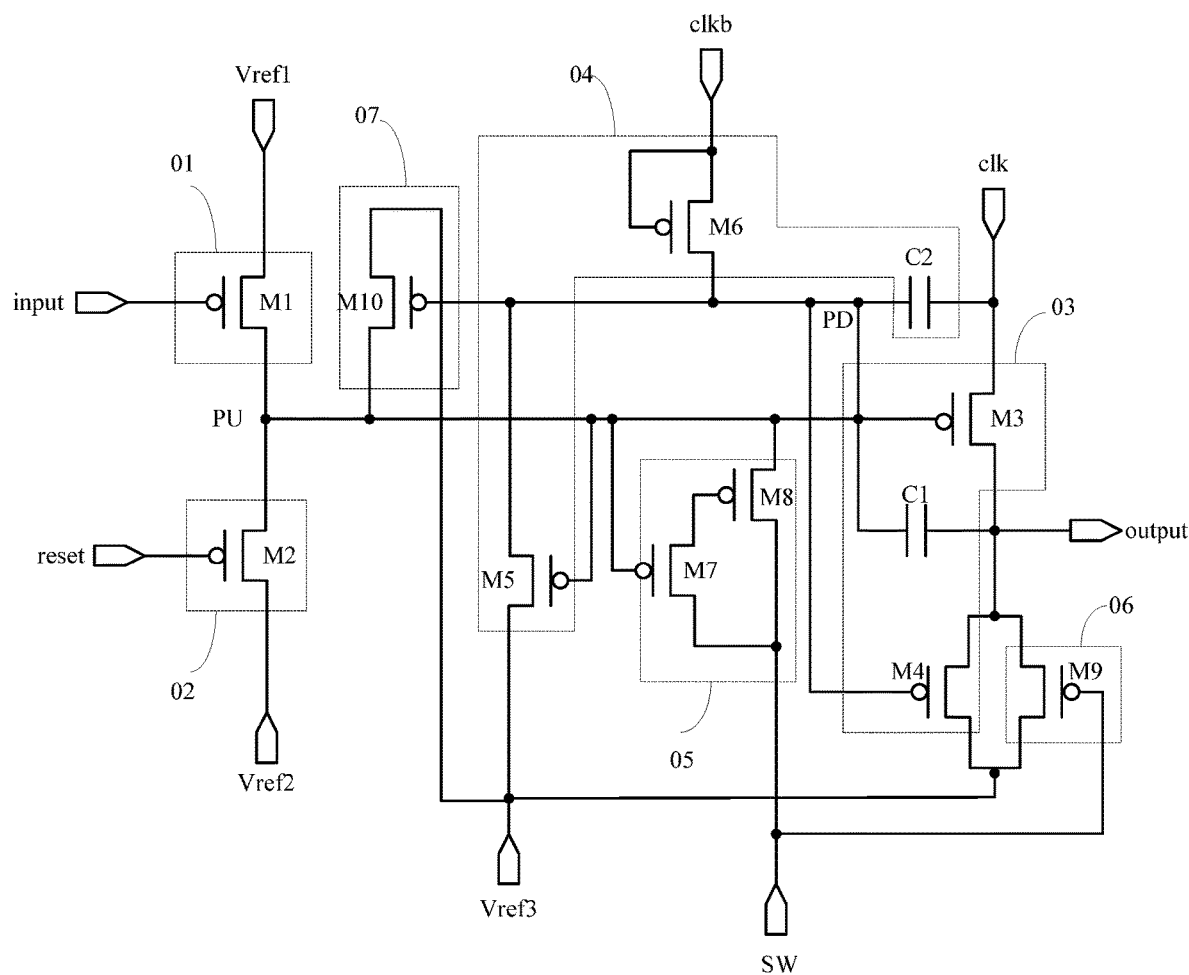
FIG. 7 is a schematic diagram of a sixth example of the shift register according to an embodiment of the present disclosure.
Figure 9:
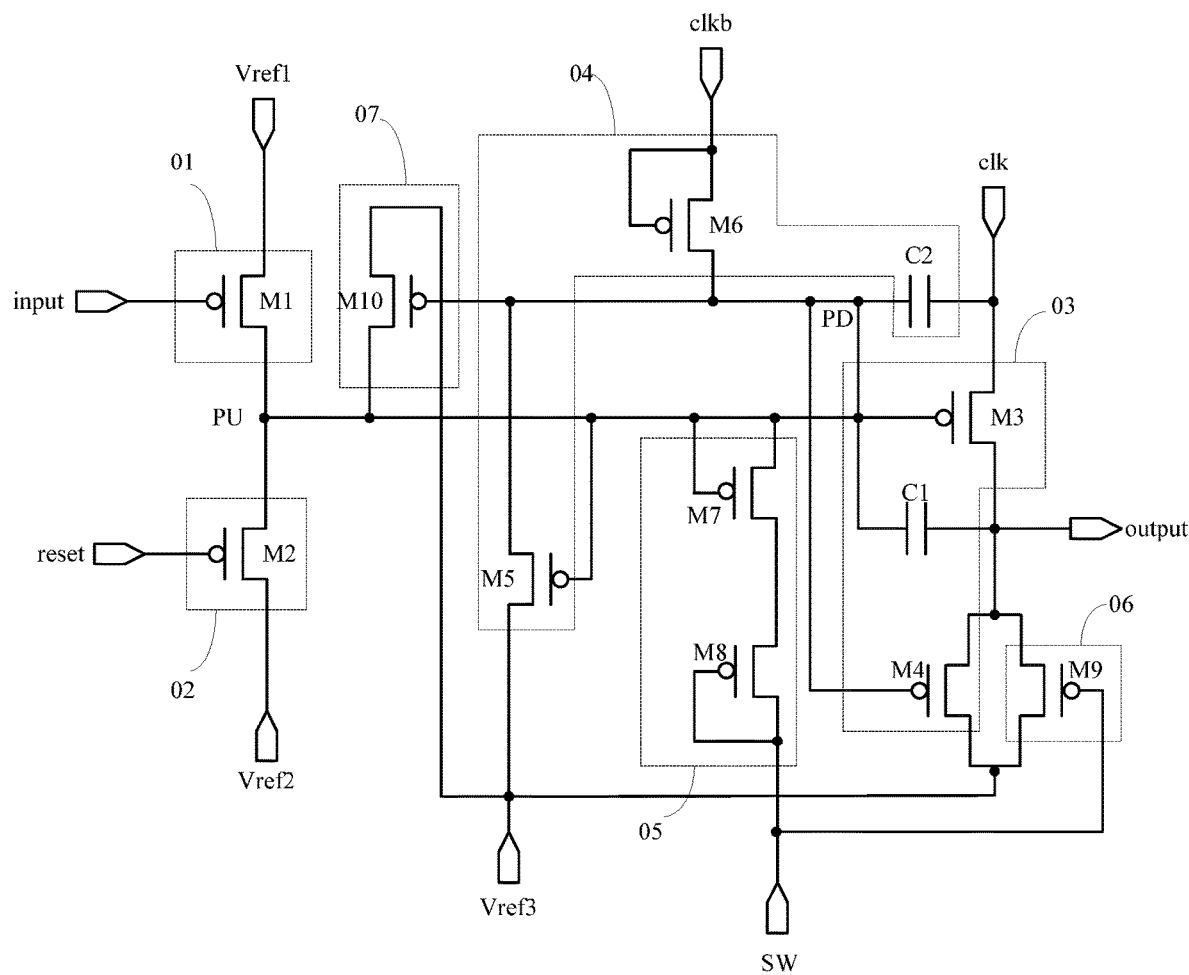
FIG. 9 is a schematic diagram of an eighth example of the shift register according to an embodiment of the present disclosure.
Figure 12:
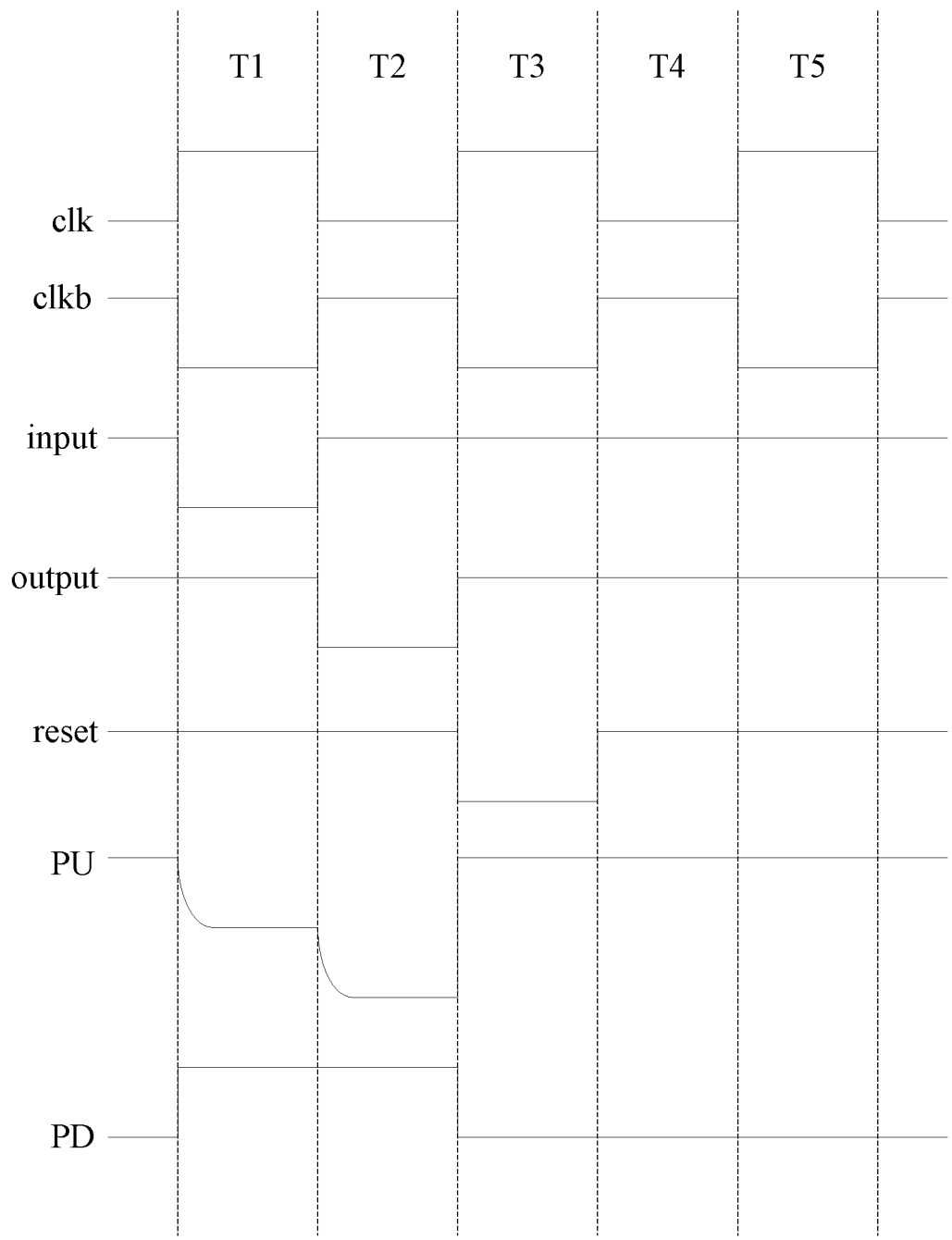
FIG. 12 is a sequence diagram of input and output corresponding to the shift registers shown in FIG. 7 and FIG. 9.

Taking the shift registers shown in FIG. 7 and FIG. 9 as an example, in the shift registers shown in FIG. 7 and FIG. 9, all of the transistors are P-type transistors, the first reference signal terminal is of low potential, the second reference signal terminal is of high potential, the third reference signal terminal is of high potential, the touch control terminal is of high potential in the display period, and the touch control terminal is of low potential in the touch control period. One corresponding sequence diagram of input and output is shown in FIG. 12.

At stage T1, input=0, reset=1, clk=1, clkb=0.

The signal from the input signal terminal enables the first transistor M1 to turn on, the signal from the first reference signal terminal Vref1 pulls down the potential of the first node PU through the first transistor M1. The first node PU controls the fifth transistor M5 and the seventh transistor M7 to turn on. The second clock signal terminal clkb controls the sixth transistor M6 to turn on. In order to make the potential of the second node PD at this stage be high potential, the fifth transistor M5 is designed to have a size greater than that of the sixth transistor M6, and a ratio of the size of the fifth transistor M5 and the size of the sixth transistor M6 is about 5:1. Then the signal from the third reference signal terminal Vref3 pulls up the potential of the second node PD through the fifth transistor M5. So, the first node PU of low potential enables the third transistor M3 to turn on, and the signal outputting terminal is of high potential. Further, the second node PD of high potential enables the fourth transistor M4 and the tenth transistor M10 to turn off, thereby ensuring output stability of the signal outputting terminal.

At stage T2, input=1, reset=1, clk=0, clkb=1.

The first node PU is in a floating state, the first node PU is still of low potential, the third transistor M3 is still turned on, but the signal of the first clock signal terminal clk is changed from high potential to low potential. Due to the bootstrap effect of the first capacitor C1, the potential of the first node PU is further pulled down. Meanwhile, the first node PU controls the fifth transistor M5 and the seventh transistor M7 to turn on. The signal from the third reference signal terminal Vref3 pulls up the potential of the second node PD through the fifth transistor M5. Then, the signal from the first clock signal terminal clk enables the signal outputting terminal to be of low potential through the third transistor M3. Further, the second node PD of high potential enables the fourth transistor M4 and the tenth transistor M10 to turn off, thereby ensuring output stability of the signal outputting terminal.

At stage T3, input=1, reset=0, clk=1, clkb=0.

The signal from the resetting signal terminal enables the second transistor M2 to turn on. The signal from the second reference signal terminal Vref2 pulls up the potential of the first node PU through the second transistor M2. The signal from the second clock signal terminal clkb enables the sixth transistor M6 to turn on. The signal from the second clock signal terminal clkb pulls down the potential of the second node PD through the sixth transistor M6. The second node PD controls the fourth transistor M4 to turn on. The signal from the third reference signal terminal Vref3 enables the signal outputting terminal to be of high potential through the fourth transistor M4. Meanwhile, the second node PD controls the tenth transistor M10 to turn on. The signal from the third reference signal terminal Vref3 pulls up the potential of the first node through the tenth transistor M10, thereby further enabling the third transistor M3 to turn off, eliminating noise voltage at the first clock signal terminal clk and ensuring output stability of the signal outputting terminal.

At stage T4, input=1, reset=1, clk=0, clkb=1.

The second node PD is in a floating state, since the potential of the first clock signal terminal clk is changed from high potential to low potential, due to the bootstrap effect of the second capacitor C2, the potential of the second node PD is further pulled down, the second node PD controls the fourth transistor M4 to turn on, the signal from the third reference signal terminal Vref3 enables the signal outputting terminal to be of high potential through the fourth transistor M4. Meanwhile, the second node PD controls the tenth transistor M10 to turn on. The signal from the third reference signal terminal Vref3 pulls up the potential of the first node through the tenth transistor M10, thereby further enabling the third transistor M3 to turn off, eliminating noise voltage at the first clock signal terminal clk and ensuring output stability of the signal outputting terminal.

At stage T5, input=1, reset=1, clk=1, clkb=0.

The signal from the second clock signal terminal clkb enables the sixth transistor M6 to turn on. The signal from the second clock signal terminal clkb pulls down the potential of the second node PD through the sixth transistor M6. The second node PD controls the fourth transistor M4 to turn on. The signal from the third reference signal terminal Vref3 enables the signal outputting terminal to be of high potential through the fourth transistor M4. Meanwhile, the second node PD controls the tenth transistor M10 to turn on. The signal from the third reference signal terminal Vref3 pulls up the potential of the first node through the tenth transistor M10, thereby further enabling the third transistor M3 to turn off, eliminating noise voltage at the first clock signal terminal clk and ensuring output stability of the signal outputting terminal.

Later, the stages T4 and T5 continue to an end of one frame. This example is suitable for the typical GOA mode as well as the full in cell display panel in the V-blank mode. In the V-blank mode, one touch control period is inserted after one frame ends and before the next frame begins. In the touch control period, the touch control terminal is of low potential and enables the ninth transistor to turn on, and the signal from the third reference signal terminal performs noise reduction for the signal outputting terminal through the ninth transistor.

Fourth Example

Figure 13:
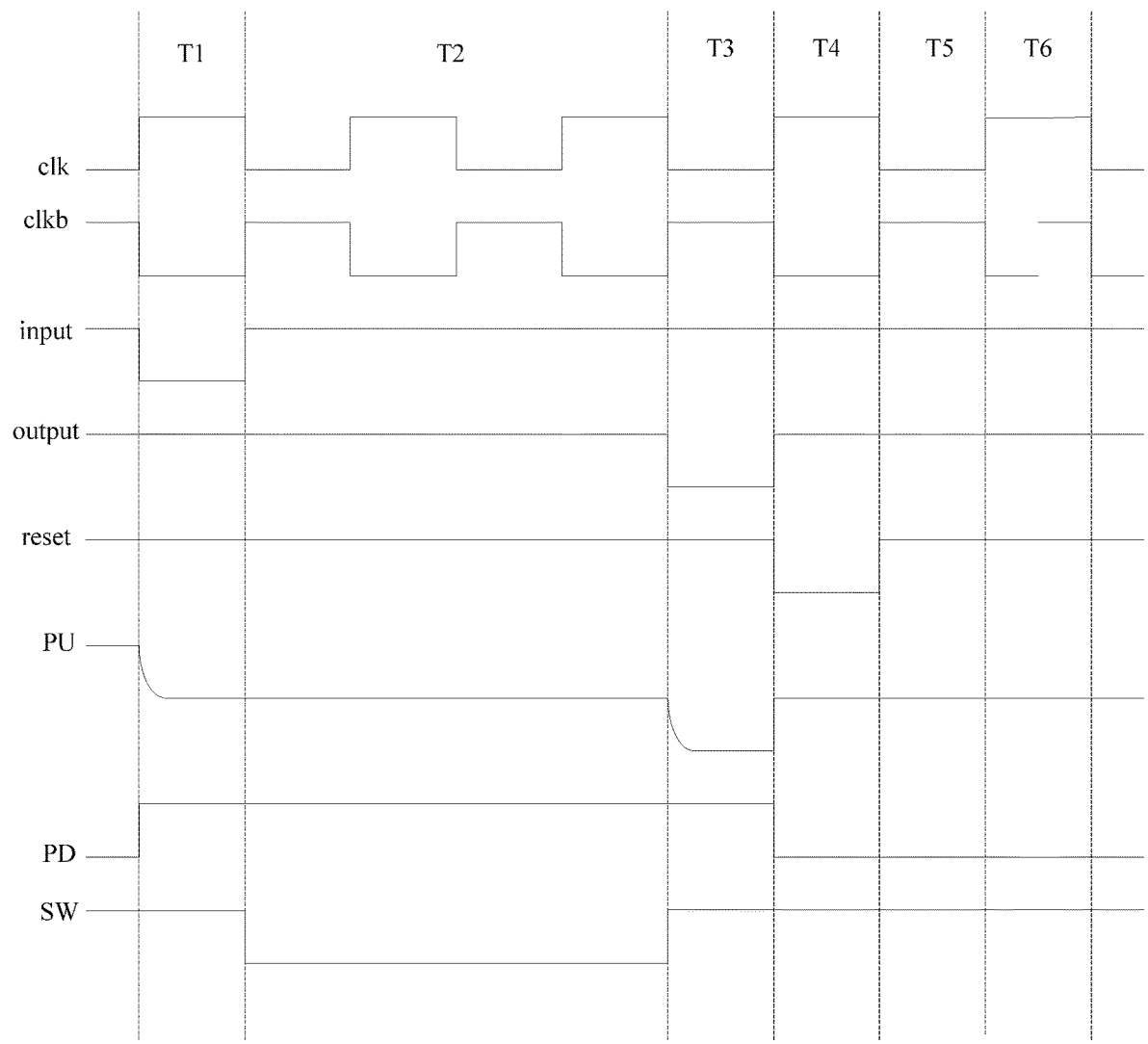
FIG. 13 is another sequence diagram of input and output corresponding to the shift registers shown in FIG. 7 and FIG. 9.

Taking the shift registers shown in FIG. 7 and FIG. 9 as an example, another corresponding sequence diagram of input and output is shown in FIG. 13.

At stage T1, input=0, reset=1, clk=1, clkb=0, SW=1.

The signal from the input signal terminal enables the first transistor M1 to turn on, the signal from the first reference signal terminal Vref1 pulls down the potential of the first node PU through the first transistor M1. The first node PU controls the fifth transistor M5 and the seventh transistor M7 to turn on. The second clock signal terminal clkb controls the sixth transistor M6 to turn on. In order to make the potential of the second node PD at this stage be high potential, the fifth transistor M5 is designed to have a size greater than that of the sixth transistor M6, and a ratio of the size of the fifth transistor M5 and the size of the sixth transistor M6 is about 5:1. Then the signal from the third reference signal terminal Vref3 pulls up the potential of the second node PD through the fifth transistor M5. So, the first node PU of low potential enables the third transistor M3 to turn on, and the signal outputting terminal is of high potential. Further, the second node PD of high potential enables the fourth transistor M4 and the tenth transistor M10 to turn off, thereby ensuring output stability of the signal outputting terminal.

At stage T2, input=1, reset=1, clk=0 or 1, clkb=1 or 0, SW=0.

In the first half of the clock cycle, the first node PU is in a floating state, the first node PU is still of low potential, the third transistor M3 is still turned on, but the potential of the first clock signal terminal clk is changed from high potential to low potential. Due to the bootstrap effect of the first capacitor C1, the potential of the first node PU is further pulled down. Meanwhile, the first node PU controls the fifth transistor M5 and the seventh transistor M7 to turn on. The signal from the third reference signal terminal Vref3 pulls up the potential of the second node PD through the fifth transistor M5. Meanwhile, the eight transistor M8 is turned on, and the first node PU is charged by the signal from the touch control terminal SW. Further, the touch control terminal SW controls the ninth transistor to turn on, and the third reference signal terminal Vref3 performs noise reduction for the signal outputting terminal through the ninth transistor M9.

Latter, no matter how the potentials of the first clock signal terminal clk and the second clock signal terminal clkb, the signal form the touch control terminal SW continuously charges the first node PU, thereby preventing attenuation of the potential of the first node PU. Since the third reference signal terminal Vref3 performs noise reduction for the signal outputting terminal through the ninth transistor M9, it is ensured that the signal outputting terminal is of high potential, thereby preventing a touch signal from being disturbed.

At stage T3, input=1, reset=1, clk=0, clkb=1, SW=1.

The first node PU is in a floating state, the first node PU is still of low potential, the third transistor M3 is still turned on, but the potential of the first clock signal terminal clk is changed from high potential to low potential. Due to the bootstrap effect of the first capacitor C1, the potential of the first node PU is further pulled down. Meanwhile, the first node PU controls the fifth transistor M5 and the seventh transistor M7 to turn on. The signal from the third reference signal terminal Vref3 pulls up the potential of the second node PD through the fifth transistor M5. Then, the signal from the first clock signal terminal clk enables the signal outputting terminal to be of low potential through the third transistor M3. Further, the second node PD of high potential enables the fourth transistor M4 and the tenth transistor M10 to turn off, thereby ensuring output stability of the signal outputting terminal.

At stage T4, input=1, reset=0, clk=1, clkb=0, SW=1.

The signal from the resetting signal terminal enables the second transistor M2 to turn on. The signal from the second reference signal terminal Vref2 pulls up the potential of the first node PU through the second transistor M2. The signal from the second clock signal terminal clkb enables the sixth transistor M6 to turn on. The signal from the second clock signal terminal clkb pulls down the potential of the second node PD through the sixth transistor M6. The second node PD controls the fourth transistor M4 to turn on. The signal from the third reference signal terminal Vref3 enables the signal outputting terminal to be of high potential through the fourth transistor M4. Meanwhile, the second node PD controls the tenth transistor M10 to turn on. The signal from the third reference signal terminal Vref3 pulls up the potential of the first node through the tenth transistor M10, thereby further enabling the third transistor M3 to turn off, eliminating noise voltage at the first clock signal terminal clk and ensuring output stability of the signal outputting terminal.

At stage T5, input=1, reset=1, clk=0, clkb=1, SW=1.

The second node PD is in a floating state, since the potential of the first clock signal terminal clk is changed from high potential to low potential, due to the bootstrap effect of the second capacitor C2, the potential of the second node PD is further pulled down, the second node PD controls the fourth transistor M4 to turn on, the signal from the third reference signal terminal Vref3 enables the signal outputting terminal to be of high potential through the fourth transistor M4. Meanwhile, the second node PD controls the tenth transistor M10 to turn on. The signal from the third reference signal terminal Vref3 pulls up the potential of the first node through the tenth transistor M10, thereby further enabling the third transistor M3 to turn off, eliminating noise voltage at the first clock signal terminal clk and ensuring output stability of the signal outputting terminal.

At stage T6, input=1, reset=1, clk=1, clkb=0, SW=1.

The signal from the second clock signal terminal clkb enables the sixth transistor M6 to turn on. The signal from the second clock signal terminal clkb pulls down the potential of the second node PD through the sixth transistor M6. The second node PD controls the fourth transistor M4 to turn on. The signal from the third reference signal terminal Vref3 enables the signal outputting terminal to be of high potential through the fourth transistor M4. Meanwhile, the second node PD controls the tenth transistor M10 to turn on. The signal from the third reference signal terminal Vref3 pulls up the potential of the first node through the tenth transistor M10, thereby further enabling the third transistor M3 to turn off, eliminating noise voltage at the first clock signal terminal clk and ensuring output stability of the signal outputting terminal.

This example is suitable for the full in cell display panel in the H-blank mode.

The above shift register of one embodiment of the present disclosure can be compatible with GOA functions (both of H-Blank and V-Blank) of Touch In Cell display panel as well as typical GOA. In a non-operating state, the second clock signal terminal controls the potential of the second node through the sixth transistor, thereby performing continuous noise reduction for the first node and thus improving the yield. Meanwhile, the shift register may have a bidirectional scanning function. Further, the shift register has advantages such as small noise and fewer transistors, thereby achieving narrower border design and reducing cost.

Figure 14:
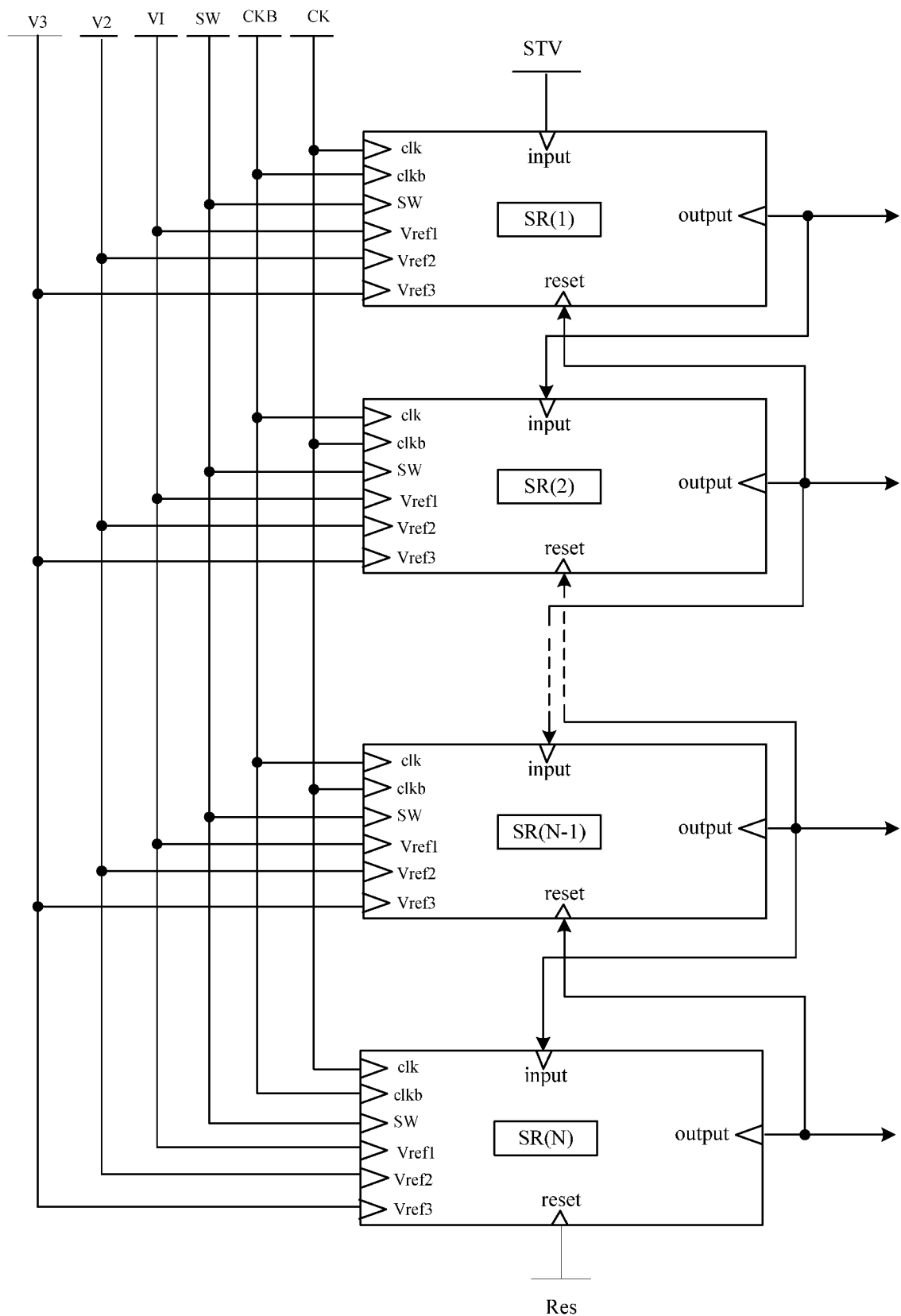
FIG. 14 is a schematic block diagram of a gate driving circuit according to an embodiment of the present disclosure.

Based on the same inventive concept, one embodiment of the present disclosure further provides a gate driving circuit. As shown in FIG. 14, the gate driving circuit includes a plurality of cascaded shift registers described above. There may be N shift registers, SR(1), SR(2) . . . SR(n) SR(N−1), SR(N), where 1≤n≤N.

Except for a first shift register SR(1), the signal outputting terminal of each of the rest of the shift registers SR(n) is connected with the resetting signal terminal of a previous shift register SR(n−1) which is adjacent the each of the rest of the shift registers;

Except for a last shift register SR(N), the signal outputting terminal of each one SR(n) of the rest of the shift registers is connected with the input signal terminal of a next shift register SR(n+1) which is adjacent the each one of the rest of the shift registers.

In actual implementation, in the above gate driving circuit, as shown in FIG. 14, the input signal terminal of the first shift register SR(1) is connected with a frame start signal (STV) terminal. The resetting signal terminal of the last shift register SR(N) is connected with a frame end signal terminal (Res).

Further, in the above gate driving circuit, the first clock signal CK, the second clock signal CKB, the first reference signal V1, the second reference signal V2, the third reference signal V3 and the touch control signal sw are input into each of the shift registers.

Based on the same inventive concept, one embodiment of the present disclosure further provides a display device which includes the above gate driving circuit. The gate driving circuit provides a scanning signal for each gate line on an array substrate of the display device. The display device may be implemented with any product or part which can have a display function, such as a mobile phone, a tablet, a television, a displayer, a laptop, a digital frame, a navigator and the like. Those skilled in the art should understand that the display apparatus may also comprise parts which are necessary for the display apparatus but are not described herein, and those parts should not be considered as a limitation to the present disclosure. Implementation of the display device can refer to the above embodiment of the gate driving circuit.

According to the shift register, the gate driving circuit and the display provided in embodiments of the present disclosure, the first inputting circuit, the second inputting circuit, the outputting circuit, the node controlling circuit, the potential hold circuit and the output-noise reduction circuit are included in the shift register. The first inputting circuit and the second inputting circuit are to implement inputting to the first node and resetting of the first node. The node control circuit controls potentials of the first node and the second node. The outputting circuit controls the signal of the signal outputting terminal under control of the first node and the second node. So basic functions of the shift register can be realized. Further, due to the presence of the potential hold circuit, the first node can be continuously charged within a touch control period by the potential hold circuit, thereby holding the potential of the first node and preventing the potential of the first node from being attenuated over time. Due to the presence of the output-noise reduction circuit, within the touch control period, the output-noise reduction circuit can perform noise reduction for the signal outputting terminal, thereby preventing a touch signal from being disturbed by the signal of the signal outputting terminal.

The above are merely the optional embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A shift register comprising:
a first inputting circuit,
a second inputting circuit,
an outputting circuit,
a node controlling circuit,
a potential hold circuit, and
an output-noise reduction circuit,
wherein the first inputting circuit is configured to, under control of an input signal terminal, provide a signal from a first reference signal terminal to a first node PU,
wherein the second inputting circuit is configured to, under control of a resetting signal terminal, provide a signal from a second reference signal terminal to the first node PU,
wherein the outputting circuit is configured to, under control of the first node PU, provide a first clock signal from a first clock signal terminal to a signal outputting terminal of the shift register, and the outputting circuit is further configured to, under control of a second node, provide a signal from a third reference signal terminal to the signal outputting terminal,
wherein the potential hold circuit is configured to, under control of both the first node and a touch control terminal, provide a signal from the touch control terminal to the first node PU,
wherein the output-noise reduction circuit is configured to, under control of the touch control terminal, provide the signal from the third reference signal terminal to the signal outputting terminal,
wherein the node controlling circuit is configured to, under control of the first node, provide the signal from the third reference signal terminal to the second node,
wherein the node controlling circuit is further configured to, under control of a second clock signal terminal, provide a second clock signal from the second clock signal terminal to the second node,
wherein the node controlling circuit is further configured to, when the second node is in a floating state, hold a stable potential difference between the second node and the first clock signal terminal,
wherein phases of the first clock signal and the second clock signal are opposite.

2. The shift register of claim 1, wherein the first inputting circuit comprises a first transistor,
wherein a gate electrode of the first transistor is connected with the input signal terminal, a first electrode of the first transistor is connected with the first reference signal terminal, and a second electrode of the first transistor is connected with the first node.

3. The shift register of claim 1, wherein the second inputting circuit comprises a second transistor,
wherein a gate electrode of the second transistor is connected with the resetting signal terminal, a first electrode of the second transistor is connected with the second reference signal terminal, and a second electrode of the second transistor is connected with the first node.

4. The shift register of claim 1, wherein the outputting circuit comprises a third transistor, a fourth transistor and a first capacitor,
wherein a gate electrode of the third transistor is connected with the first node, a first electrode of the third transistor is connected with the first clock signal terminal, and a second electrode of the third transistor is connected with the signal outputting terminal,
wherein a gate electrode of the fourth transistor is connected with the second node, a first electrode of the fourth transistor is connected with the third reference signal terminal, and a second electrode of the fourth transistor is connected with the signal outputting terminal,
wherein the first capacitor is connected between the first node and the signal outputting terminal.

5. The shift register of claim 1, wherein the node control circuit comprises a fifth transistor, a sixth transistor and a second capacitor,
wherein a gate electrode of the fifth transistor is connected with the first node, a first electrode of the fifth transistor is connected with the third reference signal terminal, and a second electrode of the fifth transistor is connected with the second node,
wherein a gate electrode and a first electrode of the sixth transistor are connected with the second clock signal terminal, and a second electrode of the sixth transistor is connected with the second node,
wherein the second capacitor is connected between the second node and the first clock signal terminal.

6. The shift register of claim 1, wherein the potential hold circuit comprises a seventh transistor and an eighth transistor,
wherein a gate electrode of the seventh transistor is connected with the first node, a first electrode of the seventh transistor is connected with the touch control terminal, and a second electrode of the seventh transistor is connected with a gate electrode of the eighth transistor,
wherein a first electrode of the eighth transistor is connected with the touch control terminal, and a second electrode of the eighth transistor is connected with the first node.

7. The shift register of claim 1, wherein the potential hold circuit comprises a seventh transistor and an eighth transistor,
wherein a gate electrode and a first electrode of the seventh transistor are connected with the first node, and a second electrode of the seventh transistor is connected with a first electrode of the eighth transistor,
wherein a gate electrode and a second electrode of the eighth transistor are connected with the touch control terminal.

8. The shift register of claim 1, wherein the output-noise reduction circuit comprises a ninth transistor,
wherein a gate electrode of the ninth transistor is connected with touch control terminal, a first electrode of the ninth transistor is connected with the third reference signal terminal, and a second electrode of the ninth transistor is connected with the signal outputting terminal.

9. The shift register of claim 1, further comprising a node-noise reduction circuit,
wherein the node-noise reduction circuit is configured to, under control of the second node, provide the signal from the third reference signal terminal to the first node.

10. The shift register of claim 9, wherein the node-noise reduction circuit comprises a tenth transistor,
wherein a gate electrode of the tenth transistor is connected with the second node, a first electrode of the tenth transistor is connected with the third reference signal terminal, and a second electrode of the tenth transistor is connected with the first node.

11. The shift register of claim 1, wherein the first inputting circuit comprises a first transistor, a gate electrode of the first transistor is connected with the input signal terminal, a first electrode of the first transistor is connected with the first reference signal terminal, and a second electrode of the first transistor is connected with the first node,
wherein the second inputting circuit comprises a second transistor, wherein a gate electrode of the second transistor is connected with the resetting signal terminal, a first electrode of the second transistor is connected with the second reference signal terminal, and a second electrode of the second transistor is connected with the first node,
wherein the outputting circuit comprises a third transistor, a fourth transistor and a first capacitor, a gate electrode of the third transistor is connected with the first node, a first electrode of the third transistor is connected with the first clock signal terminal, and a second electrode of the third transistor is connected with the signal outputting terminal, a gate electrode of the fourth transistor is connected with the second node, a first electrode of the fourth transistor is connected with the third reference signal terminal, and a second electrode of the fourth transistor is connected with the signal outputting terminal, the first capacitor is connected between the first node and the signal outputting terminal,
wherein the node control circuit comprises a fifth transistor, a sixth transistor and a second capacitor, a gate electrode of the fifth transistor is connected with the first node, a first electrode of the fifth transistor is connected with the third reference signal terminal, and a second electrode of the fifth transistor is connected with the second node, a gate electrode and a first electrode of the sixth transistor are connected with the second clock signal terminal, and a second electrode of the sixth transistor is connected with the second node, the second capacitor is connected between the second node and the first clock signal terminal,
wherein the potential hold circuit comprises a seventh transistor and an eighth transistor, a gate electrode of the seventh transistor is connected with the first node, a first electrode of the seventh transistor is connected with the touch control terminal, and a second electrode of the seventh transistor is connected with a gate electrode of the eighth transistor, a first electrode of the eighth transistor is connected with the touch control terminal, and a second electrode of the eighth transistor is connected with the first node.

12. The shift register of claim 11, wherein the output-noise reduction circuit comprises a ninth transistor, a gate electrode of the ninth transistor is connected with touch control terminal, a first electrode of the ninth transistor is connected with the third reference signal terminal, and a second electrode of the ninth transistor is connected with the signal outputting terminal.

13. The shift register of claim 12, further comprising a node-noise reduction circuit configured to, under control of the second node, provide the signal from the third reference signal terminal to the first node, wherein the node-noise reduction circuit comprises a tenth transistor, a gate electrode of the tenth transistor is connected with the second node, a first electrode of the tenth transistor is connected with the third reference signal terminal, and a second electrode of the tenth transistor is connected with the first node.

14. The shift register of claim 13, wherein all of the transistor are N-type transistors or P-type transistors.

15. The shift register of claim 1, wherein the first inputting circuit comprises a first transistor, a gate electrode of the first transistor is connected with the input signal terminal, a first electrode of the first transistor is connected with the first reference signal terminal, and a second electrode of the first transistor is connected with the first node,
wherein the second inputting circuit comprises a second transistor, wherein a gate electrode of the second transistor is connected with the resetting signal terminal, a first electrode of the second transistor is connected with the second reference signal terminal, and a second electrode of the second transistor is connected with the first node,
wherein the outputting circuit comprises a third transistor, a fourth transistor and a first capacitor, a gate electrode of the third transistor is connected with the first node, a first electrode of the third transistor is connected with the first clock signal terminal, and a second electrode of the third transistor is connected with the signal outputting terminal, a gate electrode of the fourth transistor is connected with the second node, a first electrode of the fourth transistor is connected with the third reference signal terminal, and a second electrode of the fourth transistor is connected with the signal outputting terminal, the first capacitor is connected between the first node and the signal outputting terminal,
wherein the node control circuit comprises a fifth transistor, a sixth transistor and a second capacitor, a gate electrode of the fifth transistor is connected with the first node, a first electrode of the fifth transistor is connected with the third reference signal terminal, and a second electrode of the fifth transistor is connected with the second node, a gate electrode and a first electrode of the sixth transistor are connected with the second clock signal terminal, and a second electrode of the sixth transistor is connected with the second node, the second capacitor is connected between the second node and the first clock signal terminal,
wherein the potential hold circuit comprises a seventh transistor and an eighth transistor, a gate electrode and a first electrode of the seventh transistor are connected with the first node, and a second electrode of the seventh transistor is connected with a first electrode of the eighth transistor, a gate electrode and a second electrode of the eighth transistor are connected with the touch control terminal.

16. The shift register of claim 15, wherein the output-noise reduction circuit comprises a ninth transistor, a gate electrode of the ninth transistor is connected with touch control terminal, a first electrode of the ninth transistor is connected with the third reference signal terminal, and a second electrode of the ninth transistor is connected with the signal outputting terminal.

17. The shift register of claim 16, further comprising a node-noise reduction circuit configured to, under control of the second node, provide the signal from the third reference signal terminal to the first node, wherein the node-noise reduction circuit comprises a tenth transistor, a gate electrode of the tenth transistor is connected with the second node, a first electrode of the tenth transistor is connected with the third reference signal terminal, and a second electrode of the tenth transistor is connected with the first node.

18. The shift register of claim 17, wherein all of the transistor are N-type transistors or P-type transistors.

19. A gate driving circuit comprising: a plurality of cascaded shift registers of claim 1,
wherein except for a first shift register, the signal outputting terminal of each of the rest of the shift registers is connected with the resetting signal terminal of a previous shift register which is adjacent the each of the rest of the shift registers;
wherein except for a last shift register, the signal outputting terminal of each one of the rest of the shift registers is connected with the input signal terminal of a next shift register which is adjacent the each one of the rest of the shift registers.

20. A display device comprising: the gate driving circuit of claim 19.

* * * * *